US006713793B1

(12) United States Patent
Suzuki et al.

(10) Patent No.: US 6,713,793 B1
(45) Date of Patent: Mar. 30, 2004

(54) FIELD EFFECT TRANSISTOR STRUCTURE WITH BENT GATE

(75) Inventors: Satoshi Suzuki, Tokyo (JP); Tetsuo Kunii, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/613,749

(22) Filed: Jul. 11, 2000

(30) Foreign Application Priority Data

Jul. 15, 1999 (JP) ........................................ P 11-201609

(51) Int. Cl.⁷ ...................... H01L 29/80; H01L 31/112; H01L 23/34
(52) U.S. Cl. ...................... 257/276; 257/275; 257/712; 257/713
(58) Field of Search .................................. 257/401, 280, 257/281, 282, 283, 284, 287, 270, 276

(56) References Cited

U.S. PATENT DOCUMENTS

| | | | | |
|---|---|---|---|---|
| 3,737,743 A | * | 6/1973 | Goronkin et al. | 317/235 |
| 3,829,883 A | * | 8/1974 | Bate | 317/235 |
| 4,315,272 A | * | 2/1982 | Vorhaus | 357/22 |
| 5,001,108 A | * | 3/1991 | Taguchi | 505/1 |
| 5,003,370 A | * | 3/1991 | Kashiwagi | 357/39 |
| 5,294,824 A | * | 3/1994 | Okada | 257/409 |
| 5,411,901 A | * | 5/1995 | Grabowski et al. | 437/40 |
| 5,474,948 A | * | 12/1995 | Yamazaki | 148/DIG. 136 |
| 5,763,927 A | * | 6/1998 | Kosishikawa | 257/408 |
| 5,818,077 A | * | 10/1998 | Takahashi et al. | 257/276 |
| 5,872,611 A | * | 2/1999 | Hirata et al. | 349/147 |
| 5,883,407 A | * | 3/1999 | Kunii et al. | 257/275 |
| 5,910,670 A | * | 6/1999 | Ludikhuizke | 257/343 |
| 5,925,901 A | * | 7/1999 | Tsutsui | 257/276 |
| 5,953,093 A | * | 9/1999 | Hirata et al. | 349/143 |
| 6,313,512 B1 | * | 11/2001 | Schmitz et al. | 257/341 |
| 6,316,827 B1 | * | 11/2001 | Asano et al. | 257/275 |

FOREIGN PATENT DOCUMENTS

| | | | |
|---|---|---|---|
| JP | 61-232682 | * | 10/1986 |
| JP | 3-191533 | * | 8/1991 |
| JP | 3-270024 | * | 12/1991 |
| JP | 4-6839 | | 1/1992 |
| JP | 11-330085 | * | 11/1999 |

* cited by examiner

*Primary Examiner*—Wael Fahmy
*Assistant Examiner*—Shrinivas H. Rao
(74) *Attorney, Agent, or Firm*—Leydig, Voit & Mayer, Ltd.

(57) ABSTRACT

An inexpensive and small-sized semiconductor device with high power output performance includes a semiconductor substrate; an active region on the semiconductor substrate; first and second channel regions on the active region so that width directions of the first and second channel regions are substantially perpendicular to each other, bent gate electrodes on the first and second channel regions; and source electrodes and drain electrodes on opposite sides of the bent gate electrodes.

8 Claims, 19 Drawing Sheets

FIELD EFFECT TRANSISTOR STRUCTURE WITH BENT GATE

BACKGROUND OF THE INVENTION

1. Technical field of the Invention

The present invention relates to a semiconductor device, particularly an inexpensive, small-sized and high-output semiconductor device, and a process for manufacturing the same.

2. Description of Related Arts

Field-effect transistors (FET) using compound semiconductors such as gallium arsenide (GaAs) and the like have been conventionally used as the main devices of equipment for use in satellite and mobile communications because of their high frequency and high output characteristics. With the recent drastic advance in information technology, further improvement in performance, cost and size are demanded for FETs.

FIGS. 17 and 18 show a conventional discrete type high-output multi-finger FET chip (200) for use in a transmission amplifier for mobile communication. The FET chip (200) has a rectangular substrate (202) formed of semi-insulating gallium arsenide. An insulating region (204) and an active region (206), not overlapped on each other, are formed on one surface of the substrate (202) (the upper side in FIG. 18). A number of FET elements (hereinafter referred to as "FET units") are formed on the active region (206). The FET unit includes a narrow gate a electrode (208) which extends parallel to the direction of the shorter edge of the FET chip (200) (in the Y-axial direction in FIG. 17), a source wire (210) and a drain wire (212). The gate electrode (208) is directly formed at a regular interval on the substrate (202). On the other hand, the source wire (210) and the drain wire (212) are arranged on the substrate (202) through a source electrode (226) and a drain electrode (228), respectively, and the source wire (210) and the drain wire (212) are opposed to each other through the gate electrode (208).

The gate electrode (208) is electrically connected to a gate feeder (222) which is arranged along the longer edge of the substrate (202). The gate feeder (222) is electrically connected to a gate pad (214) which is arranged on a portion of the insulating region adjacent to one of the longer edges of the substrate (202). A source pad (216) is arranged between each of adjacent gate pads (214). The source pad (216) and the source wire (210) are electrically connected to each other through an air bridge (210f) which is located therebetween above the gate feeder (222). On the other hand, the drain wire (212) is electrically connected to a drain pad (218) which is arranged on a portion of the insulating region adjacent to another longer edge of the substrate (202).

A via-hole (220) penetrating the substrate (202) is formed in each of the source pads (216), and through this via-hole (220), each of the source pads (216) is electrically connected to a gold plated layer (232) on the other side of the substrate (202).

In the FET chip (200) thus constructed, a current supplied to the source pad (216) passes through the source wire (210), the source electrode (226), a portion of the active layer adjacent to the gate electrode (208), namely a channel (230), the next drain electrode (228), and further the drain pad (218) through the drain wire (212). At this stage, by increasing or decreasing the voltage applied to the gate electrode (208), the current flowing from the source pad (216) to the drain pad (218) can be varied.

The FET chip (200) also has a plurality of gate electrodes (208) which are arranged in parallel. The total width of the plurality of gate electrodes (208) is very wide, so that the FET chip (200) can generate high output when a great amount of current is allowed to pass therethrough.

Specifically, the FET chip (200) shown in FIG. 17 is used an amplifier of a frequency of 1 to 2 GHz and an output power of 100 watts. In this case, each of the gate electrodes (208) is about 900 $\mu$m in width. There are arranged one hundred gate electrodes (208), and thus, the total width of the gate electrodes (the length of the gate layer) is about 100 mm.

FIGS. 19 and 20 show a high output FET chip (250) having a source island via-hole (SIV) structure provided with a heat sink. In this FET chip (250), two source electrodes (226) are arranged in parallel between each of adjacent gate electrodes (208). A slot-like via-hole (220) is formed between two source electrodes (226) A parallel thereto, and through this via-hole (220), the two source electrodes (226) are electrically connected to a gold plated layer (232) which is provided on the reverse surface of the substrate (202) as a heat sink for releasing heat.

The gold plating layer (232) can be used as an earth electrode. In this case, the distance between the source electrode (226) and the earth becomes shorter, so that the parasitic inductance is decreased. Therefore, the FET chip (250) is particularly suited for use in a high frequency range.

It is needed to increase the drain current and/or to improve the withstand voltage of the FET chip (200) between the gate and the drain in order to enhance the output features of the foregoing FET chip (200). The withstanding voltage between the gate and the drain varies depending upon the withstanding voltage of each of the FET units. On the other hand, in order to increase the drain current, it is necessary to increase the total width of the gate electrodes. Then, in order to increase the total width of the gate electrodes, it is necessary to increase the number of FET units and the width of the gate electrode of the FET units. In this case, there arises a new problem in that the size of the FET chip becomes larger.

There are several restrictions in decreasing the size of the FET chip. This will be described in detail hereinafter. A large current flows between the source and the drain. For example, during an operation, alternating current flows between the source and the drain, and an average current per unit width of the gate is about 200 mA/mm, and the maximal current is larger than the average current. To allow the maximal current to flow, certain widths are needed between the source electrode (226) and the drain electrode (228), and between the source wire (210) and the drain wire (212).

However, the FET chip (200) shown in FIGS. 17 and 18 has a problem in that, while it is possible to allow a comparatively large current to flow to the source wire (210) in contact with the source electrode (226) and to the drain wire (212) in contact with the drain electrode (228), there is a limit, to the current which flows to the air bridge (210f) because the section of the air bridge (210f) for connecting the source wire (212) to the source pad (216) is small. Therefore, the allowable current of the FET chip (200) is determined depending on the allowable current of the air bridge (210f).

In addition, the thickness of the air bridge (210f) is as comparatively high as several micrometers. Therefore, it is difficult to narrow the interval between each of adjacent air bridges (210f) (in other words, to increase the width of the air bridge (210f)) when the thickness of a photoresist layer for forming the air bridge (210f) is increased. For this reason, it is not easy to narrow the width of the FET chip (200) in the X-axis direction in FIG. 17.

Also, the FET chip (250) shown in FIGS. 19 and 20 has the following problem. As mentioned above, a via-hole (210) is located between a pair of source electrodes (226). In order to form such a via-hole (210), it is necessary for the FET chip (250) to have a certain length in the X-axis direction in FIG. 20. Therefore, to achieve high output from the FET chip (250), the FET chip (250) must have a at certain length in the X-axis direction. Thus, there is a limit to decreasing the length of the FET chip in the X-axis direction.

In this regard, the high output FETs having heat sink structures are already described in Japanese Kokoku Patent Publication Nos. 7-77265 and 8-21598. However, these semiconductor devices are not intended to have smaller dimensions by an optimized arrangement of semiconductor elements which compose the semiconductor devices.

SUMMARY OF THE INVENTION

The present invention is addressed to those aforementioned problem, the object of the present invention is to provide a high output semiconductor device in which the area of the chip is diminished any change in the conventional design rules. The second object of the present invention is to provide a process for constructing a small-sized and high output semiconductor device using simple steps.

In order to achieve the foregoing subject matters, the present invention provides a semiconductor device which comprises:

(a) a semiconductor substrate having a first surface and a second side;

(b) an active region formed on the first surface of the substrate;

(c) a first semiconductor element formed on the active region, including
first and second channel region formed so that the width directions of the channels are substantially perpendicular to each other,
a first source electrode and a first drain electrode, which are formed adjacent to the first and second channel regions and opposing to each other with the first and second channel regions therebetween, and which are in ohmic contact with the active region, and
a first gate electrode which is formed on the first and second channel regions and along the first source electrode and the first drain electrode, and which is bent at least one bending position; and (d) a second semiconductor element formed on the active region so as to be adjacent to the first semiconductor element, including
third and fourth channel regions which are formed adjacent to the first and second channel regions, respectively, with the first source electrode or the first drain electrode therebetween,
a second source electrode or a second drain electrode which is formed opposing the first drain electrode or the first source electrode through the third and fourth channel regions, and which is in ohmic contact with the surface of the active region, and
a second gate electrode which is formed on the third and fourth channel regions and along the second source electrode or the second drain electrode, and which is bent at least one bending position.

It becomes possible to increase the width of the gate without increasing the length of the shorter side of the active region, by employing the above structure.

Also, the present invention provides a semiconductor device according to the foregoing semiconductor device and characterized in that the source electrode and the drain electrode are composed of band electrodes, and that the bending position of the first gate electrode and the bending position of the second gate electrode are arranged on a straight line substantially in parallel with the longer side of the active region.

It becomes possible to increase the width of the gate without increasing the length of the shorter side of the active region, by employing the above structure.

Also, the present invention provides a semiconductor device according to the foregoing semiconductor device and characterized in that the following are further comprised of:

a source-drawing wire which is formed on the source electrode and along the source electrode;

a source common wire connected to the source-drawing wire;

a drain-drawing wire which is formed on the drain electrode and along the drain electrode;

a drain common wire connected to the drain-drawing wire; and a gate common wire connected to the gate electrode, wherein the drain common wire is formed opposing the source common wire and the gate common wire through the active region, and wherein the source-drawing wire is connected to the source common wire through an air bridge across the gate common wire.

It becomes possible to lessen uniformity in electric operation by employing the above structure. Also, the present invention provides a semiconductor device according to the foregoing semiconductor device and characterized in that insulating regions are formed on the semiconductor substrate and under the bending position of the first gate electrode and the bending position of the second gate electrode.

It becomes possible to reduce the concentration of electric field around the bending position of the gate electrode, by employing the above structure.

Also, the present invention provides a semiconductor device according to the foregoing semiconductor device and characterized in that the first source electrode is formed in the rectangular shape, two sides of which are adjacent to the first and second channel regions, respectively, and that the source electrode is connected to a conductive film formed on the second surface of the semiconductor substrate, through a via-hole formed in the source electrode.

It becomes possible to increase the width of the gate without increasing the shorter side of the active region also in a FET having SIV structure, by employing the above structure. In addition, the area of the source electrode can be reduced, so that the semiconductor device can be constructed at high density.

Also, the present invention provides a semiconductor device according to the foregoing semiconductor device and characterized in that insulating regions are formed on the semiconductor substrate and under the bending position of the first gate electrode and the bending position of the second gate electrode.

It becomes possible to reduce the concentration of electric field around the bending position of the gate electrode, by employing the above structure.

Also, the present invention provides a semiconductor device according to the foregoing semiconductor device and characterized in that the insulating region is formed so that the width of the first second channel region is narrower than the width of the source electrode adjacent to the channel region.

It becomes possible to electrically neutralize the corner of the source electrode by employing the above structure, so that the concentration of electric field on the corner of the source electrode can be prevented.

Also, the present invention provides a semiconductor device according to the foregoing semiconductor device and characterized in that the first gate electrode has two bending positions at which the bending directions of the first gate electrode are reversed to each other, and that the second gate electrode has such two bending positions that allow the second gate electrode to extend substantially in parallel with the first gate electrode.

The gate pad and the drain pad can be formed on the same surface of the semiconductor substrate, and thus, the construction of the semiconductor device becomes easy.

Also, the present invention provides a semiconductor device according to the foregoing semiconductor device and characterized in that the first gate electrode and the second gate electrode are arranged in parallel with each other and are connected to a common pad electrode which is formed on the bending position of the first gate electrode and the bending position of the second gate electrode.

It becomes possible to prevent a decrease in the high frequency features which occurs when the gate width is increased, by employing the above structure.

It is preferable that the semiconductor substrate is made of electrically isotropic compound.

Also, the present invention provides a semiconductor device according to the foregoing semiconductor device and characterized in that the first gate electrode and the second gate electrode share the first source electrode or the first drain electrode.

Also, the present invention provides a semiconductor device according to the foregoing semiconductor device and characterized in that the first gate electrode is bent in a vertical direction at the bending position.

Also, the present invention provides a semiconductor device according to the foregoing semiconductor device and characterized in that the angle formed by the width direction of the first gate electrode and the longer side direction of the active region is substantially 45°.

In another aspect, the present invention provides a process for manufacturing a semiconductor device, which comprises the steps of:

setting a semiconductor substrate having a first surface and a second surface, forming an active region on the first surface of the substrate, forming a first channel region and a second channel region on the active region so that the width directions of both channels are substantially perpendicular to each other, forming a gate electrode on the first and second channel regions so that the gate electrode bends at a bending position and extends along the first and second channel regions, and forming a source electrode and a drain electrode substantially in parallel with the gate electrode so that the source electrode and the drain electrode oppose to each other through the first and second channel regions.

By employing the above process, a small-sized semiconductor device can be manufactured by simple steps.

Also, the present invention provides a process according to the foregoing process and characterized by further comprising the step of forming an insulating region on the semiconductor substrate and under the bending position of the gate electrode.

Also, the present invention provides a process according to the foregoing process and characterized by further comprising the steps of forming a conductive film on the second side of the semiconductor substrate, and electrically connecting the source electrode to the conductive film through the via-hole penetrating the semiconductor substrate.

It is preferable that the source electrode is formed in the rectangular shape.

Further scope of applicability of the present invention will become apparent from the detailed description given hereinafter. However it should be understood that the detailed description and specific examples, while indicating preferred embodiments of the invention, are given by way of illustration only, since various changes and modifications within the sprit and scope of the invention will become apparent to those skilled in the art from this detailed description.

BRIEF DESCRIPTION OF THE DRAWINGS

The present invention become more fully understood from the detailed description given hereinafter and accompanying drawings which are given by way of illustration only, and thus are not limitative of the present invention and wherein.

DETAILED DESCRIPTION OF THE PREFERRED EMBODIMENTS

Embodiment 1

Figure 1:
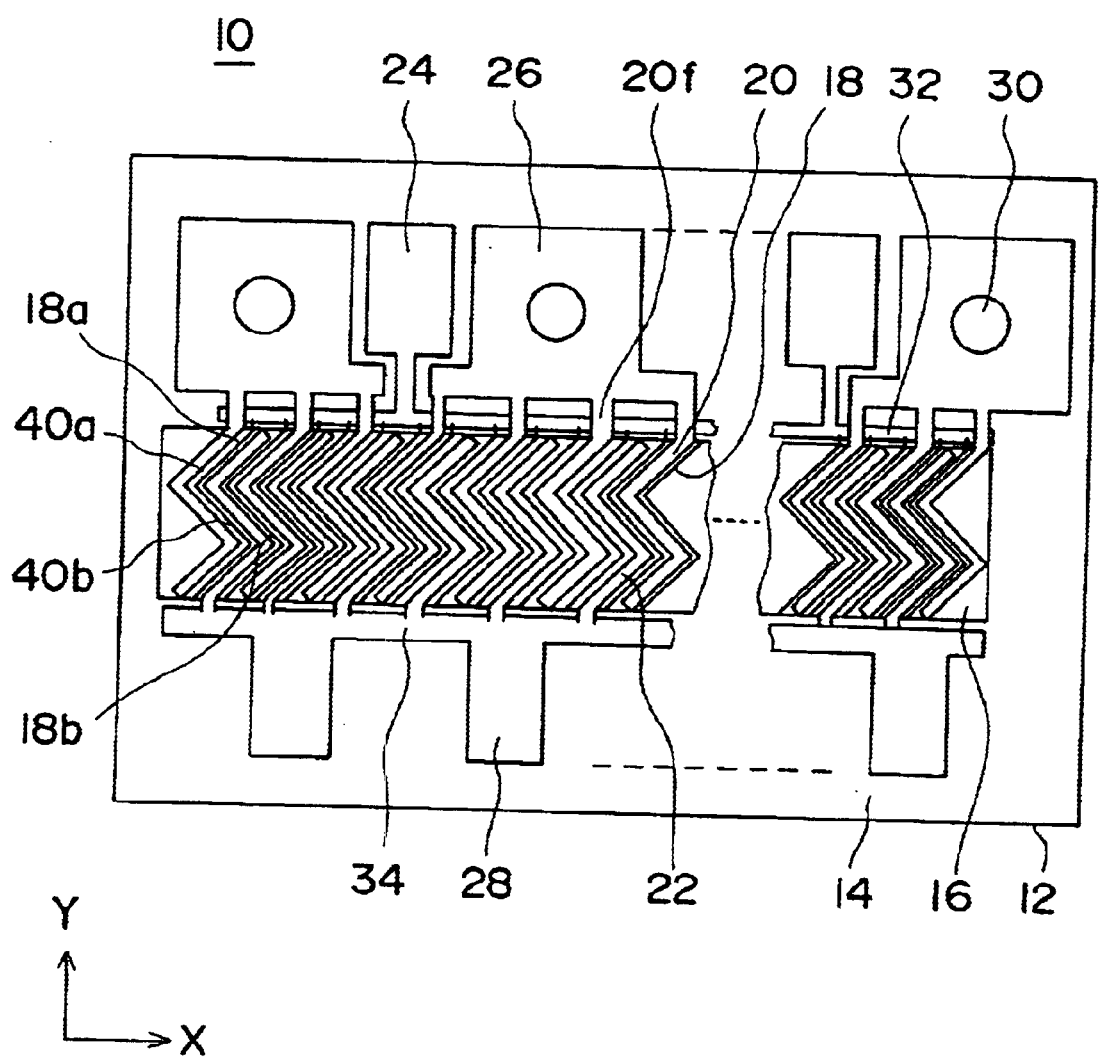
FIG. 1 is a plan view of a semiconductor device according to the first embodiment of the present invention.

FIG. 1 shows a FET chip (10) which is a multi-finger simple phased heat sink (PHS) type FET, i.e., one of a desecrate type of high power output FETs. The FET chip (10) is used for a transmission amplifier for mobile communication or the like which is required to have 100 W output in a 1 to 2 GHz frequency range. The current flowing between the source and the drain during operation of the FET chip (10) is about 200 mA/mm per unit width of a gate electrode.

As shown in FIG. 1, the FET chip (10) includes a substantially rectangular substrate (12) which is formed from a semi-insulating gallium arsenide and is electrically isotropic. One side of the substrate (12) (the top plane in FIG. 1) has an insulating region (14) and an active region (16), which are not overlapped.

A plurality of FET units (44) (each unit shown enclosed by the dotted line in FIG. 2) are formed on the active region (16). In the figure, for example, one hundred FET units (44) are parallel.

Figure 17:
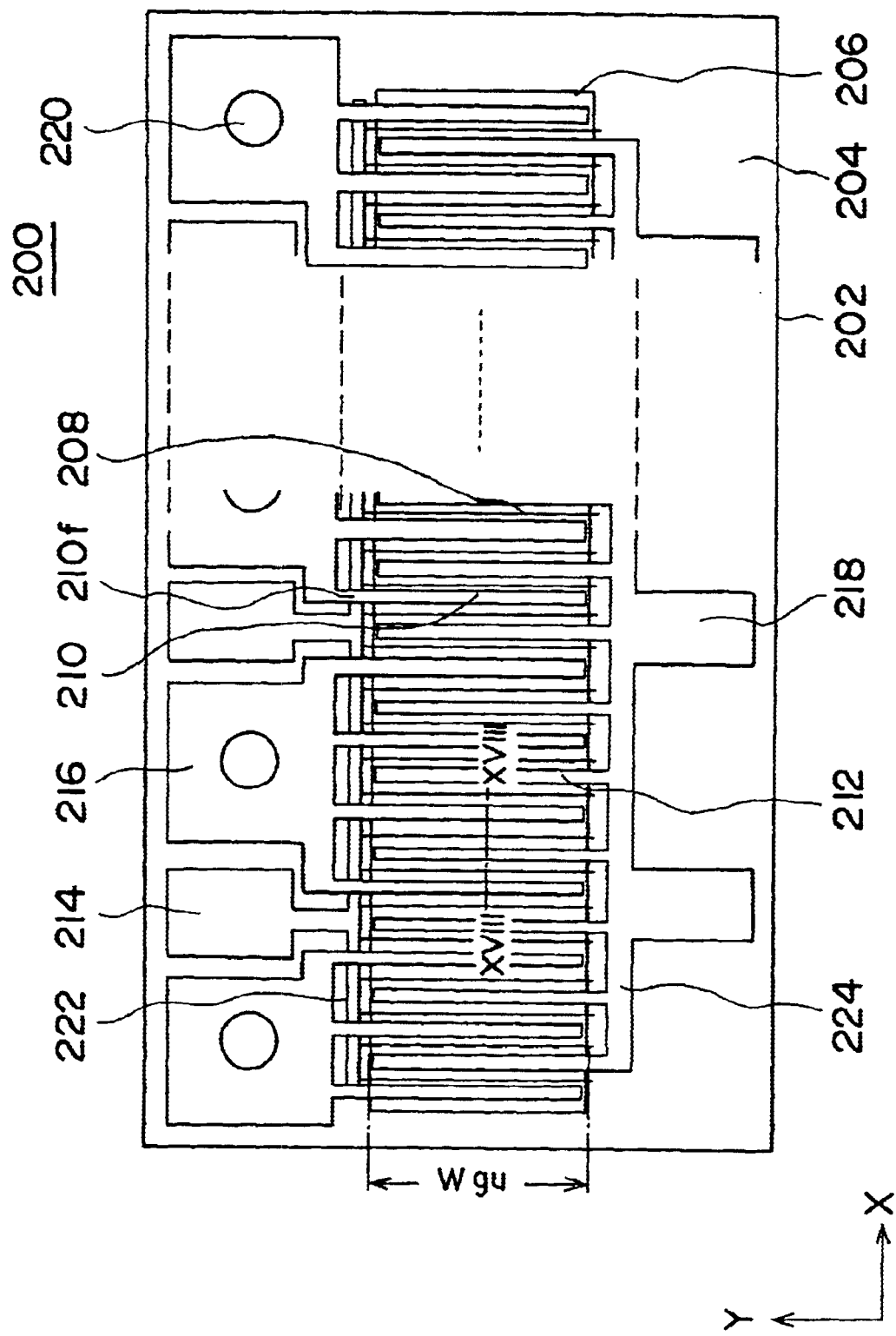
FIG. 17 is a plan view of a conventional semiconductor device.
Figure 18:
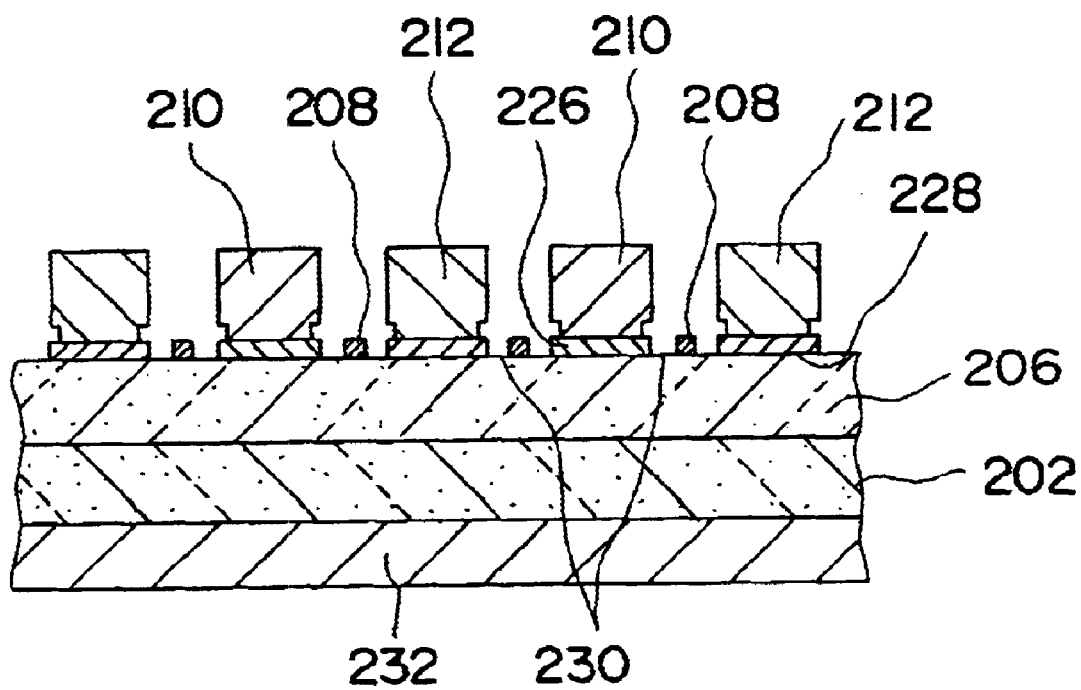
FIG. 18 is a sectional view taken along line XVIII—XVIII in FIG. 17.
Figure 19:
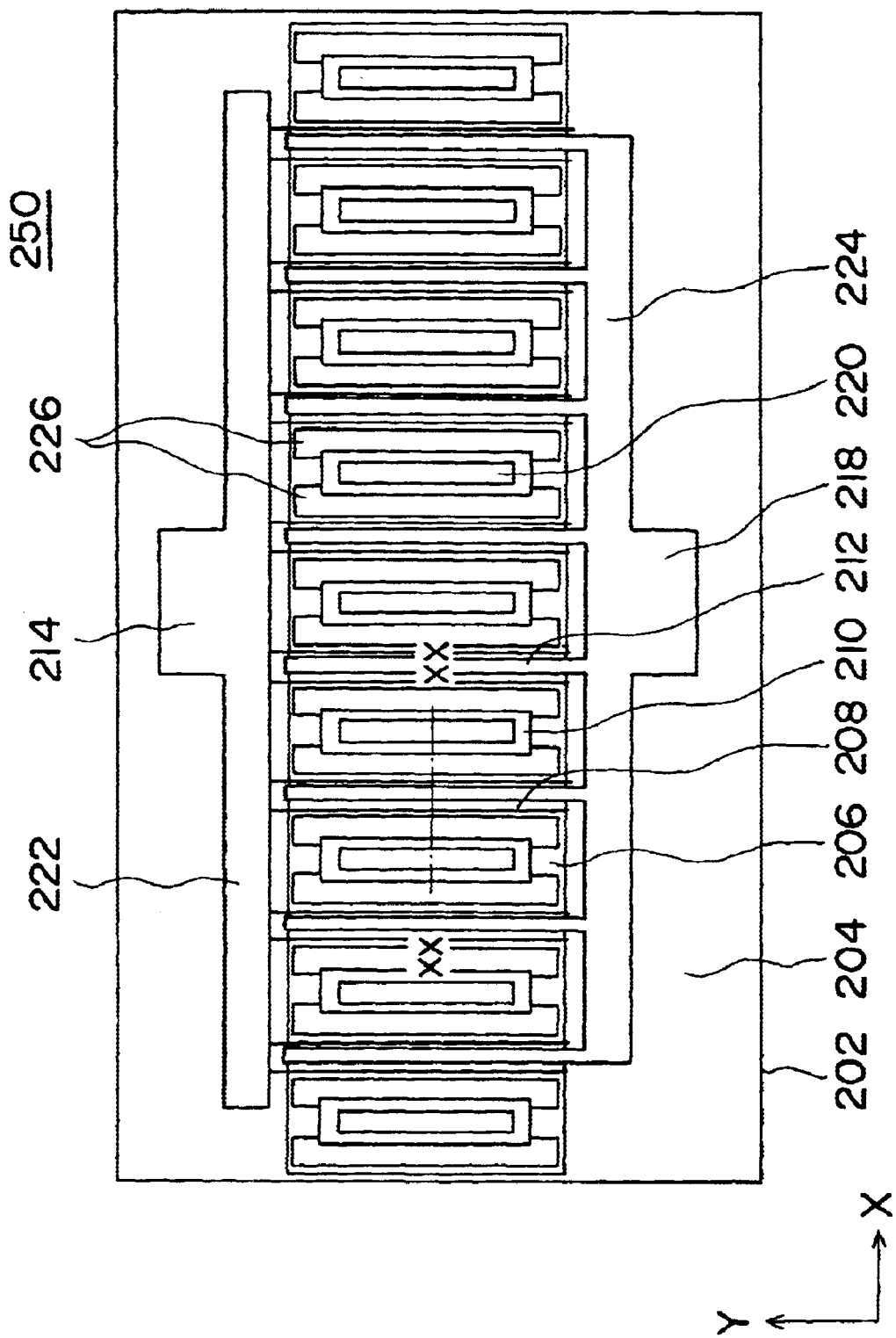
FIG. 19 is a plan view of a conventional semiconductor device.
Figure 20:
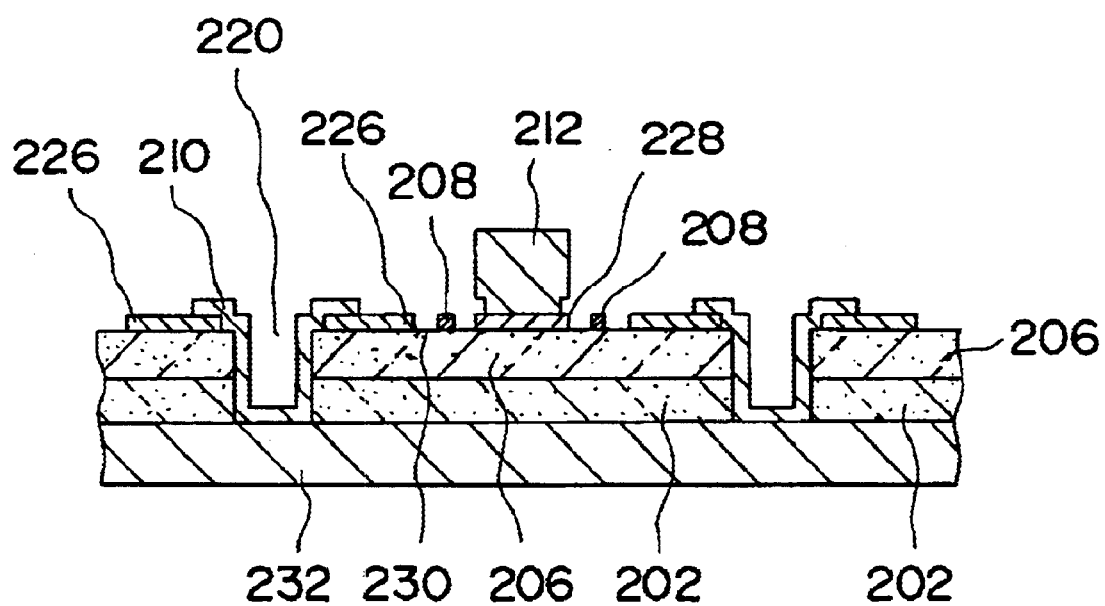
FIG. 20 is a sectional view taken along line XX—XX in FIG. 19.

The FET, unit (44) includes a narrow gate electrode (gate finger) (18), a source wire (20) and a drain wire (22), which extend parallel to reach other along the direction Y in FIG. 17, and the source wire (20) and the drain wire (22) are opposed to each other across the gate electrode (18). In particular, the gate electrodes (18), the source wires (20) and the drain wires (22) of the FET chip (10) according to this embodiment are bent at two positions (46a, 46b), respectively.

The gate electrode (18) is electrically connected to a gate feeder (32) which is arranged along the longer a edge of the substrate (12) (the X-axis direction). The gate feeder (32) is electrically connected to a gate pad (24) which is arranged on a portion of the insulating region adjacent to one of the longer edges of the substrate (12). A source pad (26) is arranged between each of adjacent gate pads (24). The source pad (26) and the source wire (20) are electrically connected to each other through an air bridge (20f) which is laid therebetween above the gate feeder (32). On the other hand, the drain wire (22) is electrically connected to a drain pad (28) which is arranged on a portion of the insulating region adjacent to another longer edge portion of the substrate (12).

Figure 3:
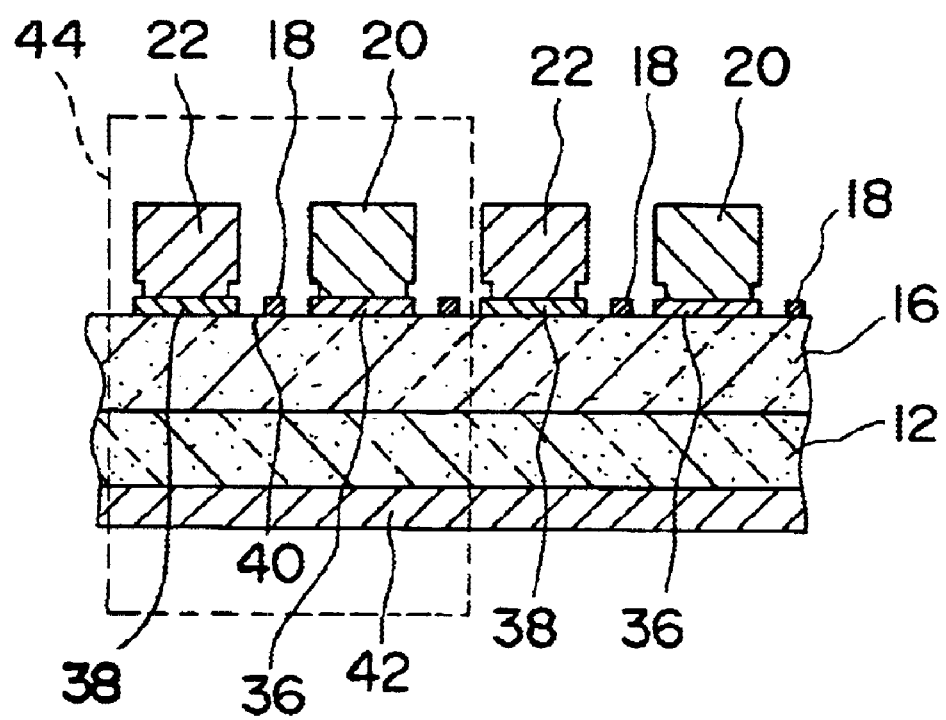
FIG. 3 is a sectional view taken along line III—III in FIG. 2.

A via-hole (30) penetrating the substrate (12) is formed in each of the source pads (26), and through this via-hole (30), each source pad (26) is electrically connected to a gold plating layer (42) on the other side of the substrate (12) (see FIG. 3).

Figure 2:
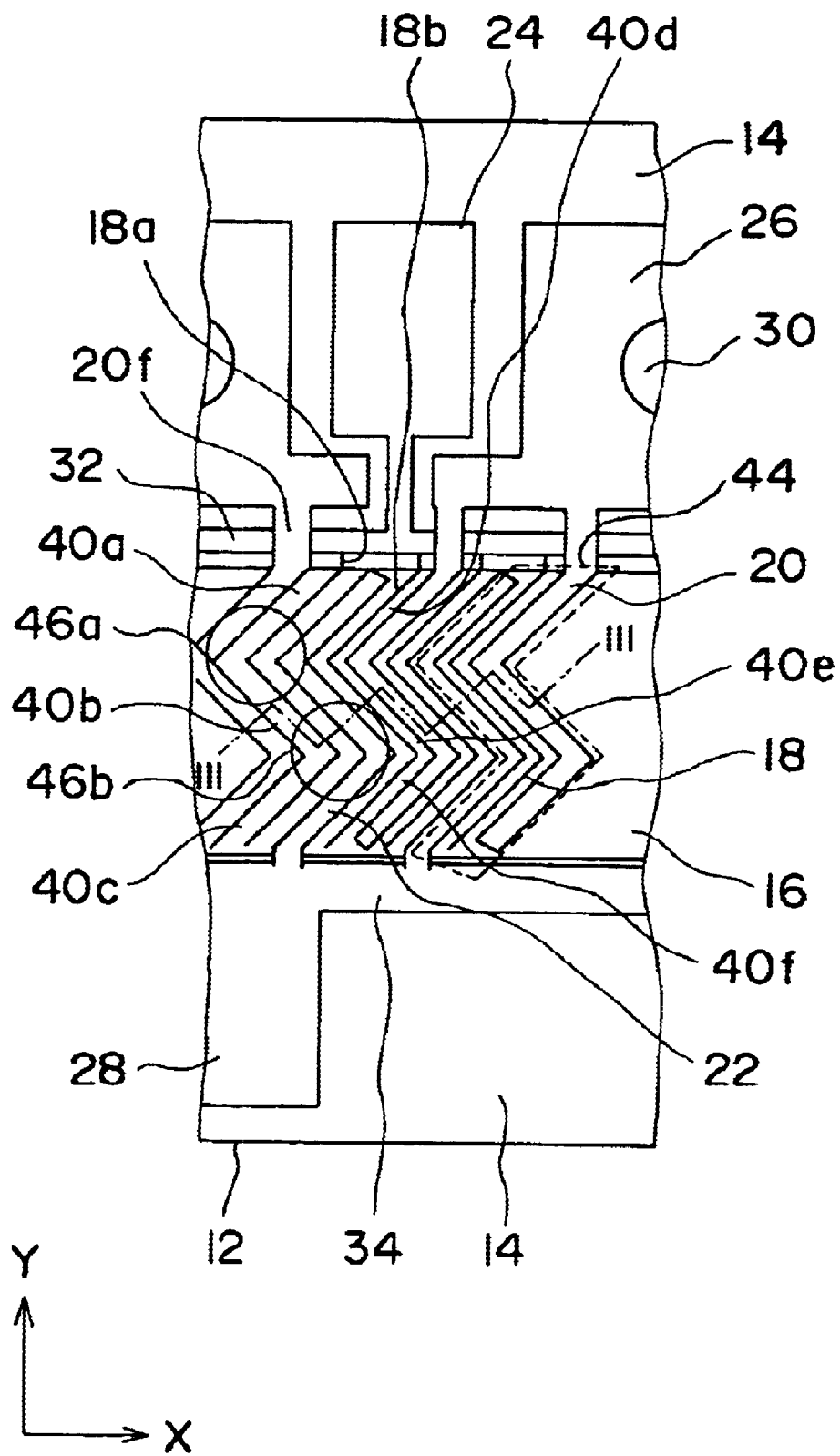
FIG. 2 is an enlarged view of the semiconductor device according to the first embodiment of the present invention.

FIG. 2 is an enlarged view of the FET chip (10) shown in FIG. 1. FIG. 3 is a sectional view taken along line III—III in FIG. 2. The plurality of FET units (44) formed on the active region (16) are described in more detail with reference to FIGS. 2 and 3.

As shown in FIG. 3, the plurality of FET units each denoted by numeral 44 are arranged in parallel on the active region (16). The FET unit (44) includes a source electrode (36) and a drain electrode (38) which are opposed to each other through a channel region (40). A source wire (20) and a drain wire (22) are arranged on the source electrode (36) and the drain electrode (38), respectively. On the other hand, a gate electrode (18) is formed on the channel region (40) and along the source electrode (36) and the drain electrode (38).

As shown in FIG. 2, the gate electrode (18) included in the FET unit (44) extends towards the Y-axial direction from the gate feeder (32) to the active region (16), and connects with the air bridge (20f) on the interface between the insulating region (14) and the active region (16). At such a connection, the gate electrode (18) is bent 45° relative to the direction (in the Y-axial direction) in which the air bridge (20f) is formed. The gate electrode (18) on the active region (16) is bent 90° at the first bending position (46a) and bent 90° at the second bending position (46b). The bending directions of the first position (46a) and the second position (46b) are reversed to each other. The source wire (20) (and the underlying source electrode (36)) and the drain wire (22) (and the underlying drain electrode (38)) are formed in parallel with the bent gate electrode (18), thus bending at the first and second bending positions (46a) and (46b), respectively.

The channel region formed between the source electrode (36) and the drain electrode (38) is also bent at the bending positions (46a) and (46b). In FIG. 2, the channel region on which the gate electrode (18a) is formed is denoted by 40a, 40b and 40c, and the channel region on which the gate electrode (18b) is formed is denoted by 40d, 40e and 40f.

In the meantime, the source electrode (36) and the drain electrode (38) are in ohmic contact with the surface of the active region (16). The interval between the source electrode (36) and the gate electrode (38) is, for example, 2.5 $\mu$m, and the interval between the drain electrode (38) and the gate electrode (18) is, for example, 3.5 $\mu$m.

In the FET chip (10) shown in FIG. 1, the shorter side of the active region (16) (the side along the Y-axial direction in FIG. 1) is about 900 $\mu$m, which is the same as that in the conventional structure shown in FIG. 17. The bending positions (46a) and (46b) are set every 300 $\mu$m in the direction of the shorter side. As mentioned above, the gate electrode (18) is bent 90° at the two bending positions (46a, 46b). Therefore, the width of; the gate electrode (18) is $\sqrt{2}$ times larger than the width of the gate electrode (208) of the conventional FET chip. In other words, it is possible to increase the width of the gate $\sqrt{2}$ times larger without a change in the shorter side (about 900 $\mu$m) of the active region (16).

This means that, when the width of the bent gate electrode (18) is the same as that of the conventional one, the length of the shorter side of the active region (16) can be reduced to $1/\sqrt{2}$ in comparison with the conventional one. As a result, the FET chip can be constructed with a smaller size without any change in the performance of the FET chip.

The source wire (20) and the drain wire (22) are arranged on the entire lengths of the source electrode (36) and the drain electrode (38), respectively. Since the source electrode (36) and the drain electrode (38) are arranged in parallel with the gate electrode (18), the source wire (20) and the drain wire (22) are also bent 90° at the first and second bending positions (46a) and (46b), accordingly.

As mentioned above, the source pad (26) and the source wire (20) are connected to each other through the air bridge (20f), and the source wire (20) is arranged in parallel with the gate electrode (18). Therefore, the air bridge (20f) and the gate electrode (18) are connected to each other while the gate electrode (18) tilts 45° to the direction in which the air bridge (20f) is formed (in the Y-axial direction in FIG. 1).

Thus, the width of the air bridge (20f) is √2 times larger than the width of the source wire (20), and it is possible increase the width of the air bridge (20f) larger than the width of the source wire (20).

In detail, the width of the air bridge (20f) is determined depending upon the flow of current passing through the air bridge (20f) and the thickness of the Au plating layer. Generally, the width of the air bridge (20f) is about 8.5 $\mu$m. On the other hand, the width of the source wire (20) is about 6 $\mu$m as well as the width of the drain wire (22).

Next, a process for manufacturing the FET chip (10) will be described hereinafter. First, the active region (16) is formed on the substrate (12) formed from a semi-insulating gallium arsenide: Si ions are implanted into the substrate (12) to form an n-GaAs region. In this connection, when the active region (16) is composed of a p-GaAs layer, Mg ions are implanted into the substrate.

Otherwise, an n-GaS epitaxial layer is formed on the substrate (12), and this layer may be used as the active region (16). In this case, for example, protons ($H^+$) are implanted into the epitaxial layer to form an insulating region (14), and other region into which protons are not implanted is used as the active region (16). The implantation depth of protons is greater than the thickness of the epitaxial layer, and generally, the implantation depth reaches the substrate (12) under the epitaxial layer.

Next, an AuGe layer (not drawn) is formed on the active region. Subsequently, the AuGe layer is patterned and processed by heat to form an alloy source electrode (36) and an alloy drain electrode (38). An $n^+$ layer is formed on a region where the source electrode (36) and the drain electrode (38) are in contact with the active layer (16), so as to achieve ohmic contact.

The source electrode (36) and the drain electrode (38) are formed bending 90° at the first and second bending positions (46a) and (46b), and extend in parallel, inclining 450 to the Y-axis shown in FIG. 1.

Next, the gate electrode (18) is formed on the channel region (40) between the source electrode (36) and the drain electrode (38), employing, for example, the lift-off technique. The gate electrode (18) is preferably formed from Al.

The gate electrode (18) is formed bending 90° at the two bending positions (46a) and (46b), in parallel with the source electrode (36) and the drain electrode (38), and the gate electrode (18) also extends inclining 45° to the axis Y as well as the source electrode (36) and the drain electrode (38).

Next, the source wire (20) excluding the air bridge (20), the drain wire (22), the gate feeder (32), the drain feeder (34), the gate pad (24), the source pad (26) and the drain pad (28) are formed by the plating technique. As shown in FIG. 2, the source wire (20) and the drain wire (22) are formed on the source electrode (36) and the drain electrode (38), respectively. It is preferable to use, for example, Au as the plating material.

Next, the air bridge (20f) for the source wire (20) is formed as follows. A pattern of piers (not drawn) and a pattern of bridge (not drawn) are separately formed by using two resist patterns, and then, subjected to selective plating.

Then, the substrate (12) is thinned and bored from the reverse surface so as to expose the source pad (26). Then, an Au plating layer (42) is formed on the reverse side of the substrate (12), and also, a via-hole (30) is formed therein. Thus, the source pad (26) and the Au plating layer (42) are connected to each other through the via-hole (30). The FET chip (10) is completed by the above steps.

Next, the operation of the FET chip (10) is described with reference to FIGS. 1 to 3. A predetermined voltage is applied across the source pad (26) and the drain pad (28) so as to operate the FET chip (10). As a result, the voltage is also applied across the drain electrode (38) and the source electrode (36) of each of the FET units (44), so that a current flows from the drain electrode (38) to the source electrode (36) through the channel region (40).

The active region (16) is of n-type, and the current referred to herein is electronic current. The electronic current flows between the semi-insulating substrate (12) and a depletion layer (not drawn) under the gate electrode (18), and this deletion layer is formed on the channel region (40) by the Schottky contact. The thickness of the depletion layer varies depending on the voltage applied to the gate electrode (18) and controls the quantity of the current flowing under the deletion layer.

As a result, the drain current is modulated by the gate voltage.

As described above, in the FET chip (10) according to this embodiment, the FET unit (44) takes a bent structure having two bending positions (46a) and (46b) Therefore, it is possible to decrease the shorter side of the active region (16) so as to reduce the area of the active region (16) without any change in the design rules.

That is, in the FET chip (10) according to this embodiment, the wire width of the air bridge (20f) is so predetermined as to satisfy the allowable current quantity, and thus, is not changed from the conventional structure. Also, the interval between the source electrode (36) and the gate electrode (18) and the interval between the drain electrode (38) and the gate electrode (18) are not changed from those of the conventional FET. Further, the interval between each of the air bridges (20f), which is limited by the production steps, is not changed.

As mentioned above, since each of the FET units (44) takes the bending structure without any change in the design rules, it becomes possible to reduce the length of the shorter side of the active region (16) to 1/√2 of the conventional one without decreasing the width of the gate electrode (18). Thus, the area of the active region (16) can be reduced despite a slight increase in the length of the longer side of the active region (16).

This is described in more detail. As shown in FIG. 1, the source pads (26) and the gate pads (24) are arranged alternately at the portion of the insulating region adjacent to one of the longer edges of the FET chip (10). Therefore, generally, in the direction along the longer side of the active region (16) (the X-axial direction), the length of the insulating region on which the source pads (26) and the gate pads (24) are formed is longer than the length of the active region (16) on which the plurality of FET units (44) are formed in parallel.

Therefore, there is very little influence on the length of the longer edge of the FET chip (10) even if the longer side of the active region (16) is slightly increased when the respective FET units (44) have the bending positions (46a, 46b). On the other hand, the length of the shorter edge of the FET chip (10) is reduced by decreasing the shorter side of the active region (16). As a result, the area of the FET chip (10) can be reduced.

In addition, because of this structure, it is also possible to increase the width of the gate electrode (18) without changing the area of the FET chip (10).

The reason why the gate electrode (18), etc. are bent 90° in the. FET chip (10) is that, generally, the compound semiconductor materials such as gallium arsenide and the like show electrical characteristics isotropic in two directions which intersect orthogonally to each other. Therefore, in the structure having bending angles of 90°, the electrical characteristics of the FET chip (10) do not change because of the bending direction of the gate electrode (18), etc., so that ununiform operation of the FET chip (10) can be prevented.

As described above, in the FET chip (10) according to this embodiment, the FET unit (44) has the positions (46a, 46b) for bending 90°, and therefore, the length of the shorter side of the active region (16) can be reduced $1/\sqrt{2}$ of that of the conventional FET chip without a change in the existing design rules. Thus, it if. becomes possible to reduce the area of the active region (16), and further to diminish the size of the FET chip (10).

Embodiment 2

Figure 4:
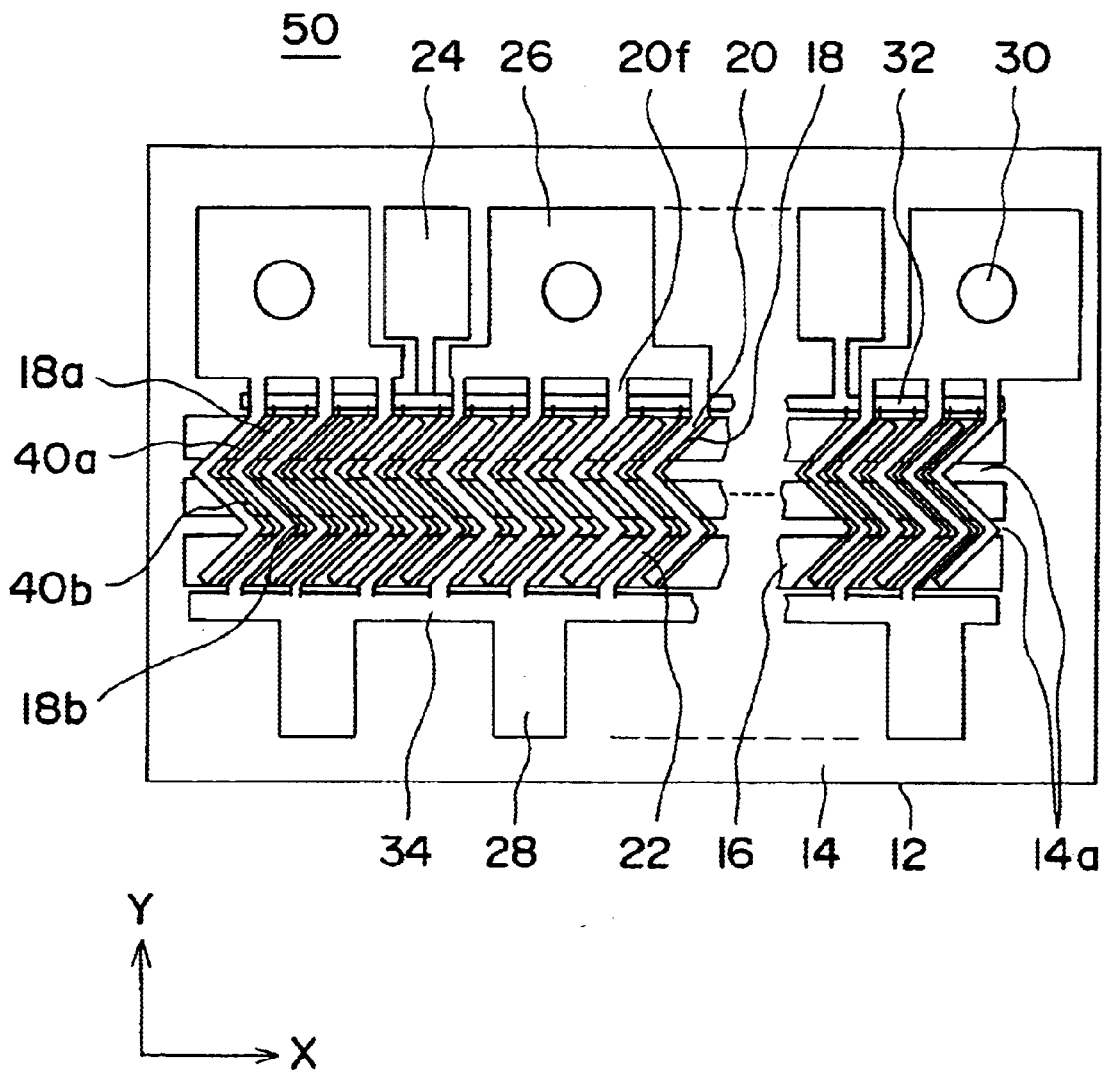
FIG. 4 is a plan view of a semiconductor device according to the second embodiment of the present invention.

FIG. 4 shows a FET chip (50) according to the second embodiment of the present invention which achieves higher performance by improving the FET chips of the first embodiment. In the FET chip (50), there are provided band-like insulating regions (14a) along the longer side (the X-axial direction) of an active region (16) under the bending positions (46a) and (46b) of a FET unit (44). Therefore, concentration of electric fields on the bending positions (46a) and (46b) can be prevented by the insulating regions (14a).

Figure 5:
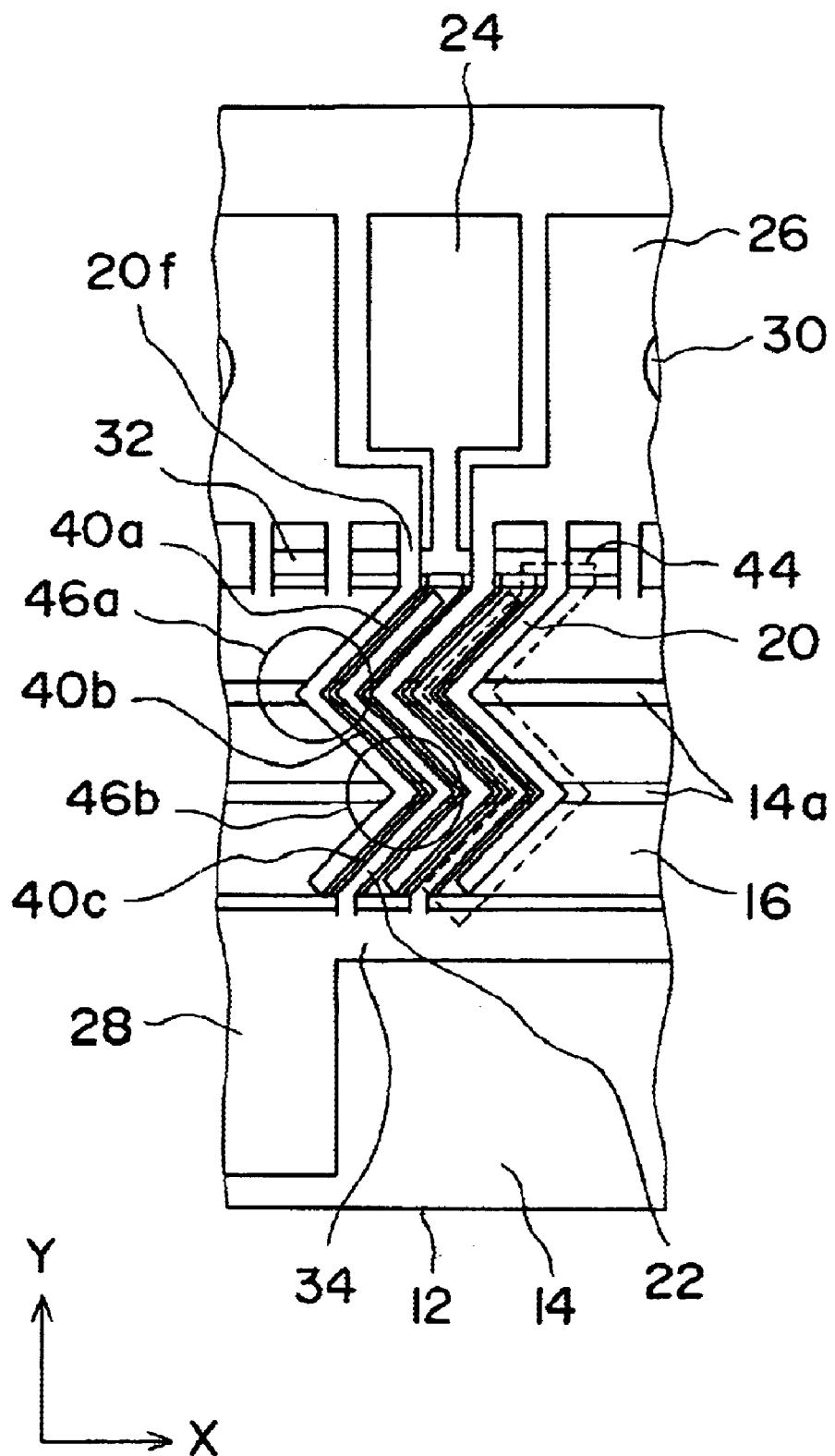
FIG. 5 is an enlarged view of the semiconductor device according to the second embodiment of the present invention.

FIG. 4 is a plan view of a multi-finger simple PHS type FET according to the embodiment of the present invention, and FIG. 5 is an enlarged view of the same. As shown in FIGS. 4 and 5, the FET chip (50) has substantially he same structure as that of the FET chip (10) as above, except that, differently from the FET chip (10), the insulating regions (14a) are provided under the bending positions (46a) and (46b).

The insulating regions (14a) are provided under the first bending position (46a) and the second bending position (46b) of the FET unit (44), respectively, 16 extending like bands along the longer side direction of the active region (16) (the X-axial direction). Thus, the concentration of electric fields on the bending positions (46a) and (46b) can be prevented.

The insulating region (14a) has a width of 1 μm and a depth larger than the thickness of the active region (16). The insulating region (14a) can be concurrently formed in the course of forming the insulating region (14).

For example, in case where an epitaxial layer of n-GaAs is used for the active region (16), the insulating region (14) is formed by implanting protons ($H^+$), and simultaneously, the insulating regions (14a) are formed.

Otherwise, in case where the active region (16) is formed by implanting the ions of impurity element into the semi-insulating GaAs substrate (12), the ions of the impurity element are implanted so that the active region (16) is formed with the insulating regions (14a) left remaining.

In the FET chip (50) having the above structure, the bending positions (46a) and (46b) of the FET are arranged on the insulating regions (14a), so that the bending positions (46a) and (46b) are electrically neutralized to prevent the concentration of electric fields thereon. By doing so, the gate-drain withstanding voltage (Vgdo) of the FET unit (44) can be enhanced. Thus, the FET chip can have high output.

Embodiment 3

Figure 6:
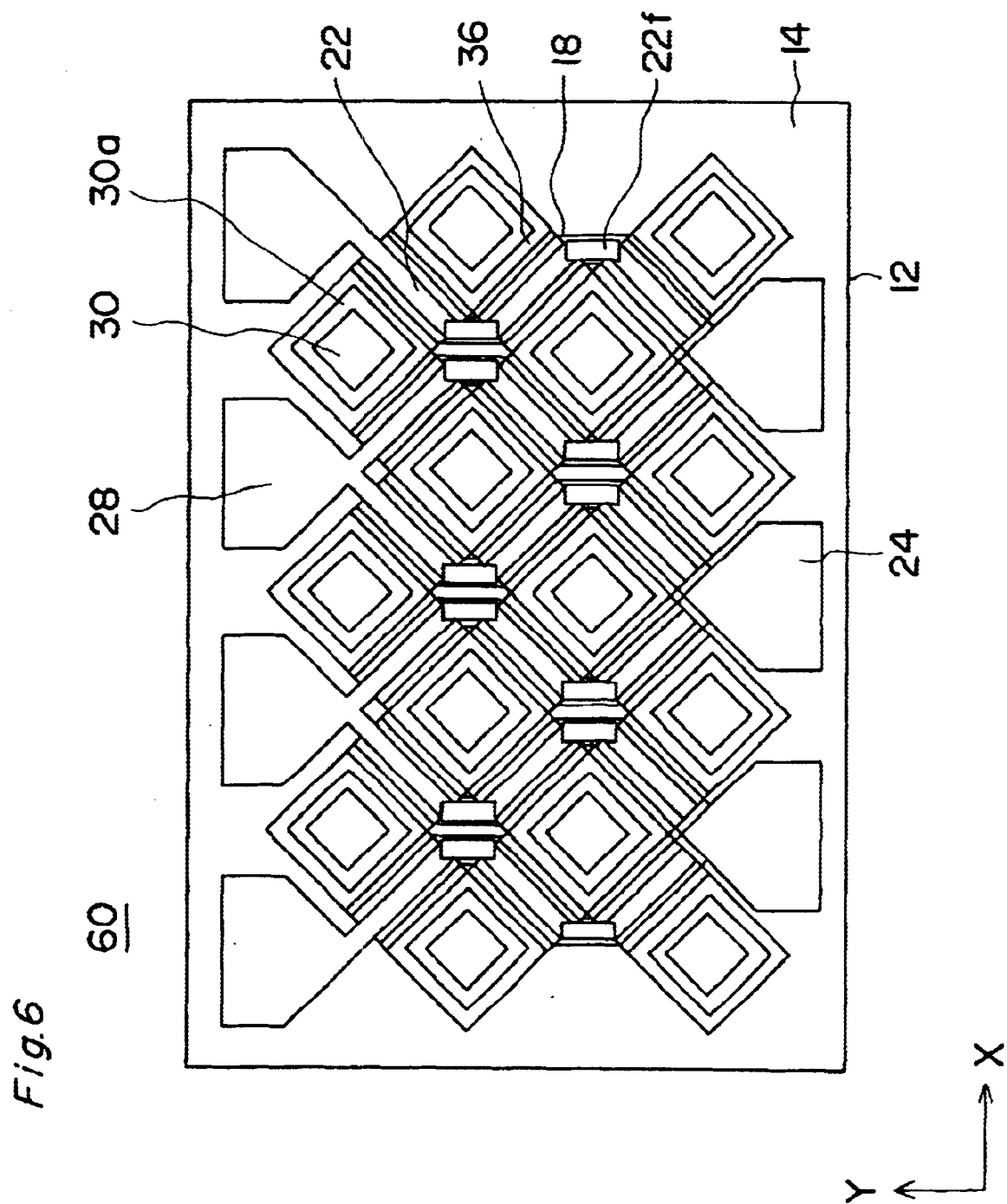
FIG. 6 is a plan view of a semiconductor device according to the third embodiment of the present invention.
Figure 7:
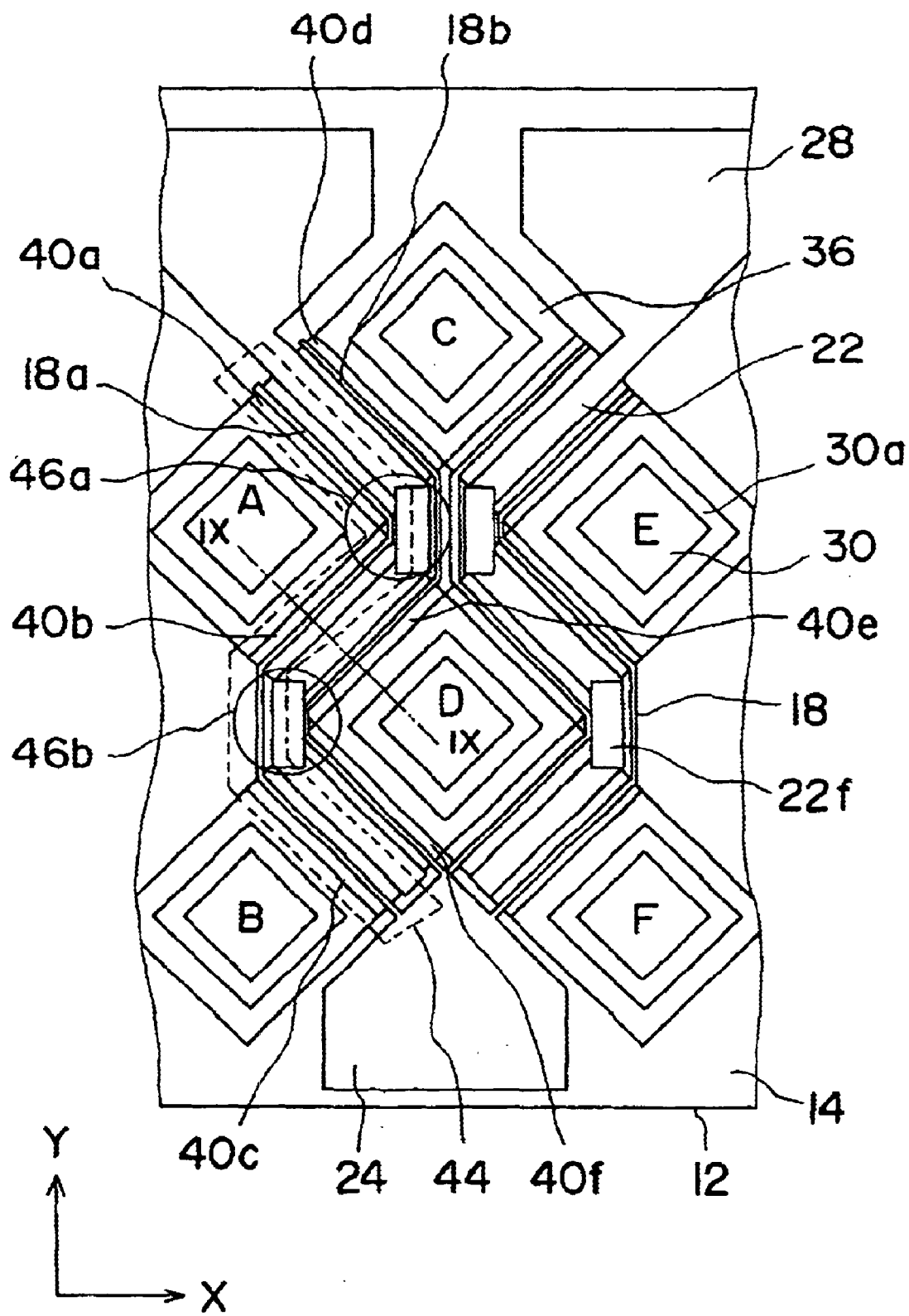
FIG. 7 is an enlarged view of the semiconductor device according to the third embodiment of the present invention.
Figure 8:
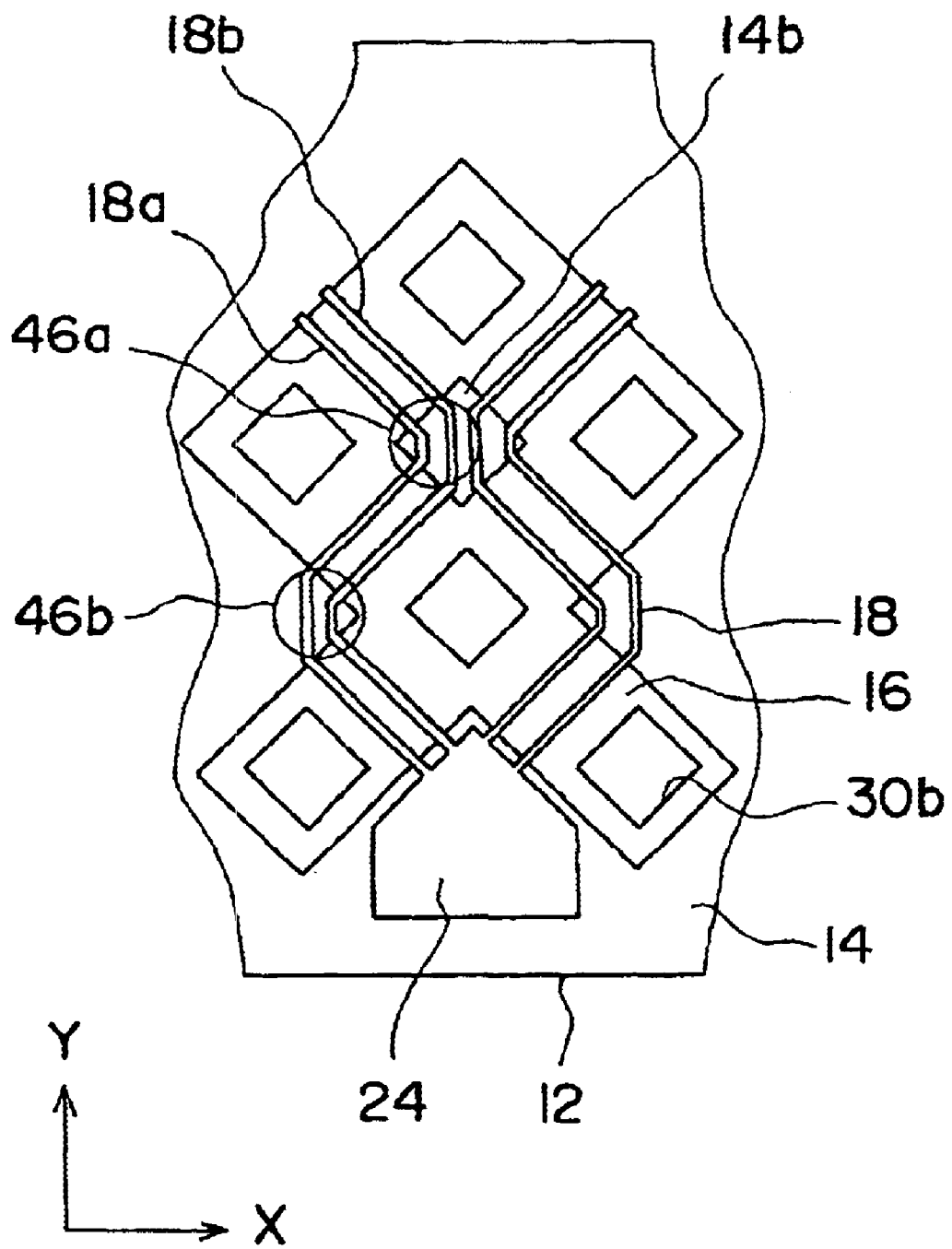
FIG. 8 is a plan view of the active region of the semiconductor device according to the third embodiment of the present invention.

FIG. 6 is a top plan view of a FET chip (60) having SIV (source island via-hole) structure according to this embodiment, and FIG. 7 is an enlarged view of the same. The FET chip (60) includes a substrate (12) formed from a semi-insulating GaAs. An active region (16) is formed on the substrate (12) as shown in FIG. 8. A plurality of source electrodes (36) are formed like a lattice on the active region (16). The source electrode (36) is formed in the shape of, for example, a 40 μm foursquare having a via-hole (30) at its center. The source electrodes (36) are formed inclining 450 to the longer edge (the X-axial direction) of the FET chip (60).

Gate pads (24) are formed on a portion of the insulating region adjacent to one of the longer edges of the substrate (12), and drain pads (28) are formed on a portion of the insulating region adjacent to the other of e longer edges of the substrate (12). The gate pads (24) d the drain pads (28) are arranged opposing to each other through the active region (16).

Figure 9:
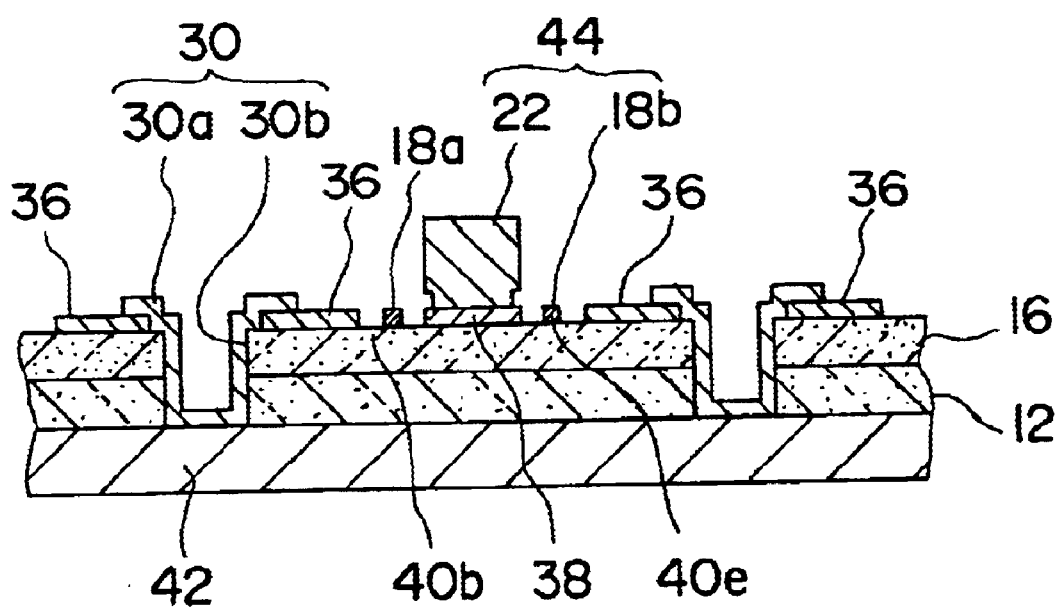
FIG. 9 is a sectional view taken along line IX—IX in FIG. 7.

FIG. 9 is a sectional view taken along line IX—IX in FIG. 7. As shown in FIG. 9, the via-hole (30) formed at he center of the source electrode (36) is composed of a through hole (30b) of 30 μm foursquare and a via-hole connection wire (30a) formed on the surface of the,through hole (30b). It is needed for the high output FET of this embodiment to have foursquare through holes (30b) whose one side is at least 30 μm. The via-hole connection wire (30a) is composed of, for example, a Au plating layer, which electrically and heat-conductively connects the source electrode (36) to the Au plating layer (42) formed on the reverse surface of the substrate (12).

One strip-like drain electrode (38) is arranged between each of two source electrodes (36) adjacent to each other. Channel regions (40b) and (40e) are formed between the drain electrode (38) and each of the two source electrodes (36).

A gate electrode (18a) is formed on the channel region (40b), and a gate electrode (18b) is formed on the channel region (40e). By this way, one drain electrode (38) serves as a common drain electrode for the two gate electrodes (18a, 18b) formed at both sides of the drain electrode (38). In other words, two FET units (44) adjacent to each other share one drain electrode (38).

Therefore, in the FET chip (60) of this embodiment, four FET units at the maximum can be formed around one source electrode (36).

This is described more in detail. As shown in FIG. 7, one gate electrode (18a) having first and second bending positions (46a) and (46b) is arranged on the channel regions (40a, 40b) along the two adjoining sides of !kg the source electrode A and on the channel region (40c) along the source electrode B. The gate electrode (18a) serves as the gate electrode (unit gate electrode) of the FET unit (44) (enclosed by the dotted line). The gate width (unit gate width) of the unit gate electrode is 120 μm. The gate electrode (18a) is connected to the gate pad (24).

Three drain electrodes (not drawn) which are arranged between the two gate electrodes (18a) and (18b) and in parallel therewith are electrically connected to one another by one drain wire (22) which is formed on the three drain electrodes so as to serve as a unit drain wire. The drain wire (22) is connected to the drain pad (28).

The drain wire (22) is closest to the adjacent drain wire (22) at the bending positions (46a) and (46b) It is needed to arrange two gate electrodes (18a, 18b) between the two drain electrodes (22) adjacent to each other at the bending positions (46a) and (46b).

In the FET chip (60), an air bridge (22f) is arranged so as to avoid the drain wire (22) from bending 90° at the bending positions (46a) and (46b) and to increase the distance between the adjacent drain wires (22). Thus, the drain wire (22) can have a steric structure by using the air bridge (22f).

The FET chip (60) shown in FIG. 6 is used in an amplifier having an output of 1 W or so in a frequency range of 10 to 20 GHz, and specifically, it is used for a transmission amplifier for mobile communication or the like. In such a FET chip (60), the width in total (Wgt) of the gate electrodes is about 1.5 mm.

Next, a process for constructing the FET chip (60) according to this embodiment is described. The FET chip (60) to be constructed has a total gate width (Wgt) of about 1.5 mm (including twelve gate electrodes, each having a unit gate width of 120 μm, and has an output of 0.7 W at a frequency of 10 GHz.

In this process, first, an active region (16) is formed on a substrate (12) formed from a semi-insulating GaAs. The active region (16) may be formed in the same manner as in the first embodiment by implanting ions into the substrate (12) to form an n-GaAs region; or the active region (16) may be formed by growing an epitaxial n-GaAs layer on the substrate (12) and implanting protons into the substrate. The active region (16) is formed in such a shape as shown in FIG. 8, and an insulating region (14) surrounds the active region (16).

Next, fourteen 40 μm foursquare source electrodes (36) are formed on the active region (16). The source electrodes (36) are formed like a lattice so that their e, sides of the source electrodes (36) incline 45° to the longer edge of the FET chip (60) (the X-axial direction). In this case, as seen in FIG. 7, a pair of source electrodes (36) in which the corners of the source electrodes (36) are opposed to each other (the pair of source electrodes A and B, C and D or E and F) are so formed as to fit to the adjacent pair of source electrodes (36) (for example, the pair of electrodes C and D relative to the pair of electrodes A and B) as if a convex portion fits in a concave portion. In this case, seven pairs of source electrodes (36) are formed in parallel along the direction of the longer edge of the FET chip (60) (along the X-axial direction). The interval between each of adjacent source electrodes (36) (for example, the electrodes A and C) is 54 μm.

Next, a strip-like drain electrode (38) is formed at the center of the confronting sides of the source electrodes (36) (for example, A and C, or B and D) which are adjacent to each other. The width of the drain electrode is 40 μm. The source electrode (36) and the drain electrode (38) are formed from an ohmic electrode material such as AuGe or the like.

Next, gate electrodes (18a, 18b) are formed between a pair of source electrodes (36) (for example, A and B) whose corners confront to each other and a pair of source electrodes (36) (for example, C and D) which are adjacent to the former pair. The gate electrodes (18a, 18b) sandwich three drain electrodes (38) therebetween, and they are formed along these drain electrodes (38).

The length of the gate electrode is determined depending on the features required for the FET to obtain. For example, suppose that the length of the gate electrode is 1 μm, then, the distance between the gate electrode and the source electrode is 2.5 μm, and the distance between the gate electrode and the drain electrode is about 3.5 μm Alternatively, where T type gate is used, the length of the gate electrode is about 0.1 μm, and the width of a wire layer formed on the T type gate is, for example, about 1 μm.

On the other hand, the gate electrodes (18a, 18b) are formed so that the gate width (unit gate width) thereof is 120 μm.

Next, the 30 μm foursquare portion at the center of the source electrode (36) is subjected to dry etching to form a hole which reaches the semi-insulating substrate (12) but does not penetrate the substrate (12). Then, an Au plating layer is so formed as to connect the source electrode (36) to the base of the hole, and the substrate (12) is etched from its reverse surface to expose the Au plating layer. Thus, the hole at the center of the source electrode (36) is finished as a through hole (30b), and the Au plating layer is finished as a via-hole connection wire (30a).

Then, a gold plating layer (42) is formed on the reverse surface of the substrate (12) for use as an earth electrode. The above gold plating layer (42) is connected to the source electrode (36) through the via-hole (30).

Next, gate pads (24) and drain pads (28) are formed on the insulating region (14) along the longer edges of the substrate (12) (the edges extending along the X-axial direction), respectively. The gate pads (24) and the drain pads (28) are composed of, for example, an Au plating layer, and they are arranged opposing each other with the active region (16) therebetween.

Next, connection wires are formed between the gate electrodes (18) and the gate pads (24), on the drain electrodes (38) except for the air bridges, and between the drain electrodes (38) and the drain pads (28), respectively. These connection wires are formed of Au plating layers.

Finally, the adjacent drain electrodes (38) are connected to each other by the air bridge wire (22f). The air bridge wire (22f) is formed as follows: the pier portions (not drawn) and the bridge portion (not drawn) are separately formed, using two resist patterns, and then, they are subjected to selective plating. Thus, the FET chip (60) is completed by the above steps.

The operation of the FET chip (60) is substantially the same as that of the FET chip (10) according to the first embodiment.

According to the FET chip (60) of this embodiment, the plurality of source electrodes (36) are arranged like a lattice. The source electrodes (36) are each formed in the shape of foursquare, and they are arranged with their sides inclining 45° to the longer edge of the substrate (12). The gate electrodes (18) are formed on the channel regions (40) and along the source electrodes (36). The gate electrodes (18) have two bending positions (46a, 46b) at which the gate electrodes (18) bend 90° but their bending directions are reversed to each other.

Thus, the FET unit (44) has two bending positions at which it bends 900 in the same manner as in the FET chip (10) of the first embodiment.

By doing so, the interval between the gate pad (24) and the drain pad (28) can be reduced to $1/\sqrt{2}$ of that in the conventional structure, without any change in the design rules of the conventional structure such as the interval between the source electrode (36) and the gate electrode (18) and the interval between the drain electrode (38) and the gate electrode (18). Further, by using the foursquare source electrode (36) as a common source electrode, the FET chip in which the FET units (44) are integrated at high density can be provided.

The source electrode (36) may be formed in the shape of rectangle, however, preferably, it is formed in the shape of foursquare. This is because, by forming the source electrode (36) in the shape of foursquare, the area of the source electrode (36) can be reduced while the area of the via-hole (30) is kept unvaried, so that the size of the FET chip can be reduced.

Embodiment 4

A FET chip according to the fourth embodiment of the present invention can show higher performance than that of the FET chip (60) according to the third embodiment. Insulating regions (14c) are provided under the bending positions (46a, 46b) of a FET unit (44), so that the width of the channel is shorter than the length of one side of the source electrode (36). Thus, concentration of an electric field on a corner of the'source electrode (36) can be prevented.

Figure 10:
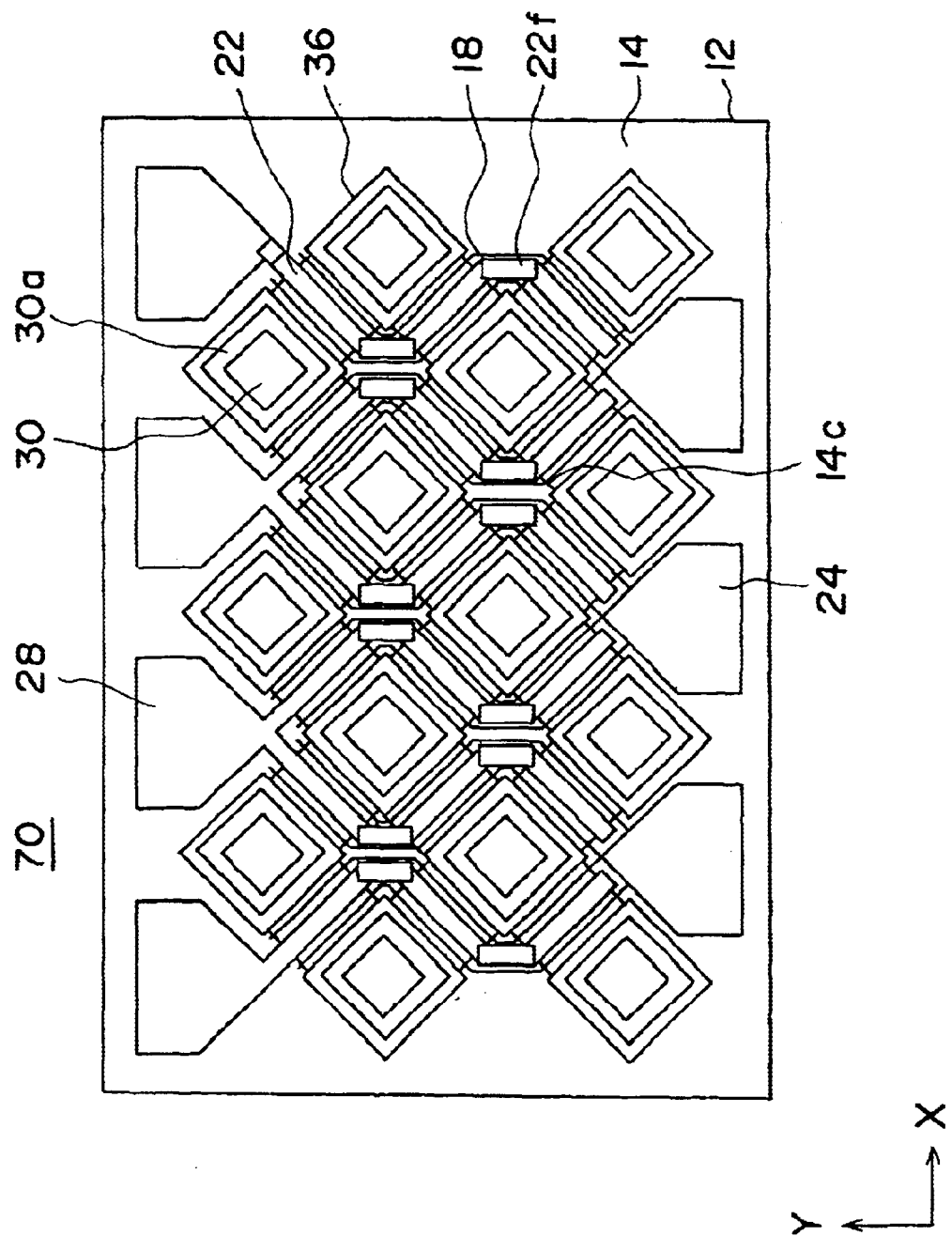
FIG. 10 is a plan view of a semiconductor device according to the fourth embodiment of the present invention.
Figure 11:
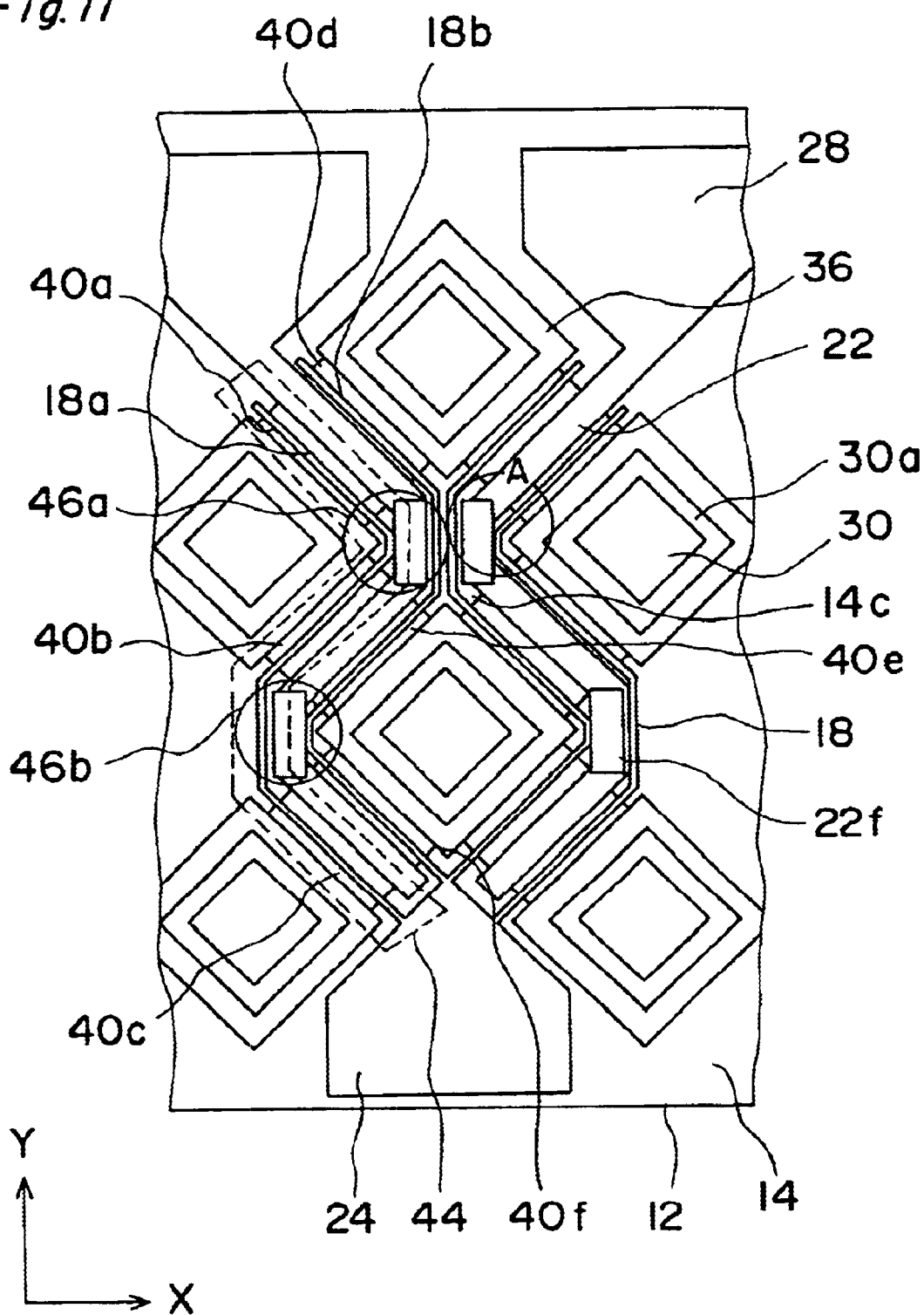
FIG. 11 is a plan view of a part of the semiconductor device according to the fourth embodiment of the present invention.

FIG. 10 is a plan view of a multi-finger simple PHS type FET chip according to this embodiment, and FIG. 11 is an enlarged view of the same. As shown in FIGS. 10 and 11, the FET chip (70) has substantially the same structure as that of the foregoing chip (60), but has difference in that the insulating regions (14c) are provided under the bending positions (46a, 46b).

As seen in FIGS. 10 and 11, the insulating region (14c) is formed in the channel region (40) surrounded by the four corners A of four source electrodes (36) so as to include the lower portions of the corners A. The bending positions (46a, 46b) of the FET unit (44) are formed on such regions.

In this regard, the steps of forming the insulating region (14c) are carried out in the same manner as that of the insulating region (14a) of the second embodiment.

Figure 12:
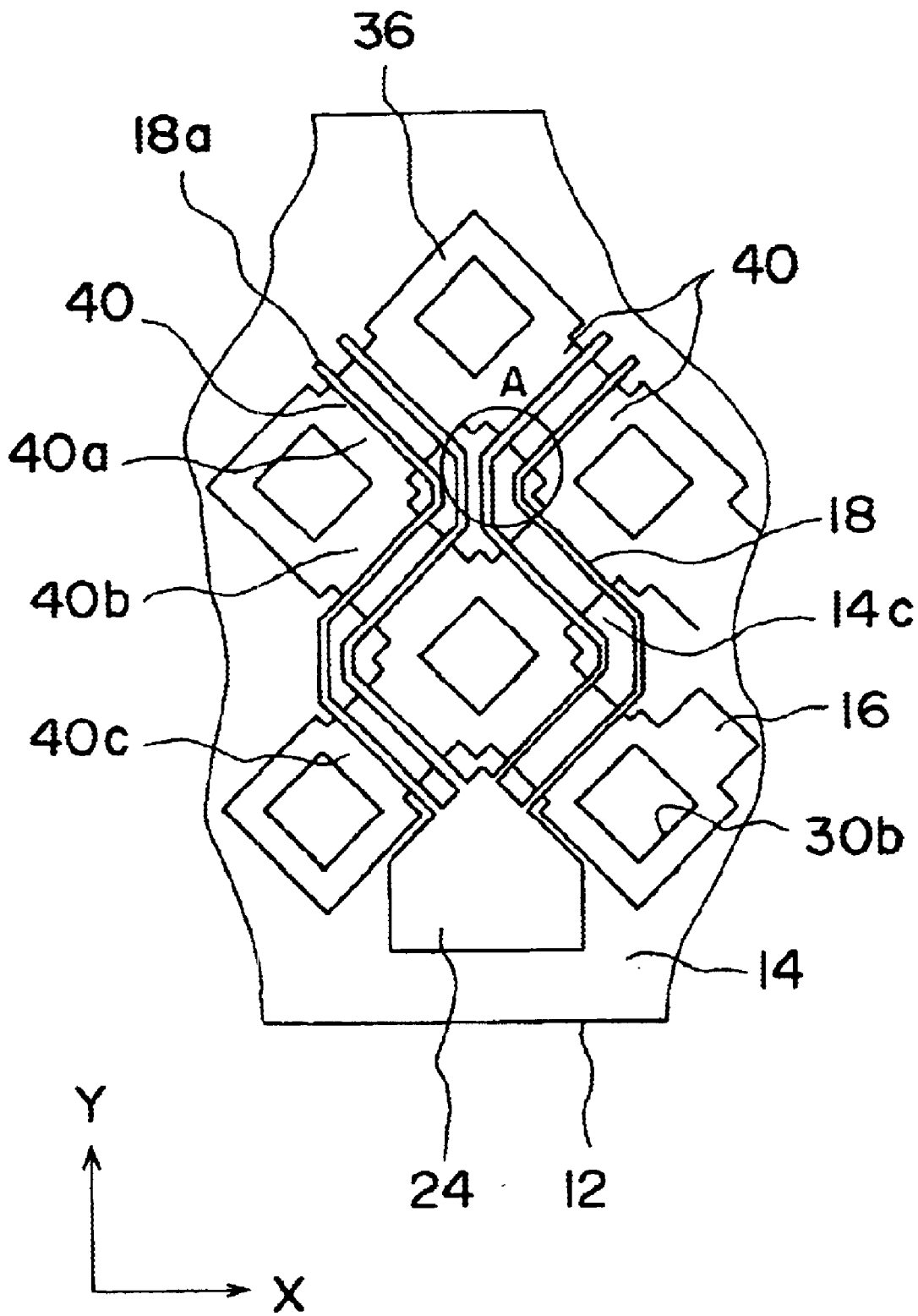
FIG. 12 is a plan view of the active region of the semiconductor device according to the fourth embodiment of the present invention.

In more detail, the source electrode (36) is formed in the shape of a 40 $\mu$m foursquare as seen in FIGS. 10, 11 and 12. The insulating region (14c) is formed in the channel region (40) surrounded by the four corners A of the four source electrodes (36). By forming such an insulating region (14c), either end of the channel region (40) sandwiched by the source electrodes (36) opposing each other is 1 $\mu$m shorter in length than one side of the source electrode (36). As a result, the effective width of the channel is 38 $\mu$m.

As shown in FIG. 11, the gate electrode (18a) included in the FET unit (44) (enclosed by the dotted line) is formed on the channel regions (40a, 40b and 40c) alongside the source electrodes (36). The gate electrode (18a) is bent 90° at two bending positions (46a, 46b) at which the bending directions are reversed to each other. The gate electrode (18a) is connected at one end to a gate pad (24). The gate electrode (18a) included in the FET unit (44) actually functions only at its portions formed on the channel regions (40a, 40b and 40c). Therefore, the effective width of the gate electrode (18a) is 114 $\mu$m (38 $\mu$m×3).

Generally, an electric field tends to concentrate on the corner A of the source electrode (36), so that leak current increases, or withstanding voltage lowers at the corner A. However, it is possible to electrically neutralize the corner A by forming the insulating region (14c) to make the channel width of the channel region (40) shorter than the length of one side of the source electrode (36). By doing so, an increase in leak current or a decrease in withstanding voltage at the corner A of the source electrode can be prevented. Thus, it becomes possible to provide the FET chip (70) particularly excellent in output performance.

Embodiment 5

Figure 13:
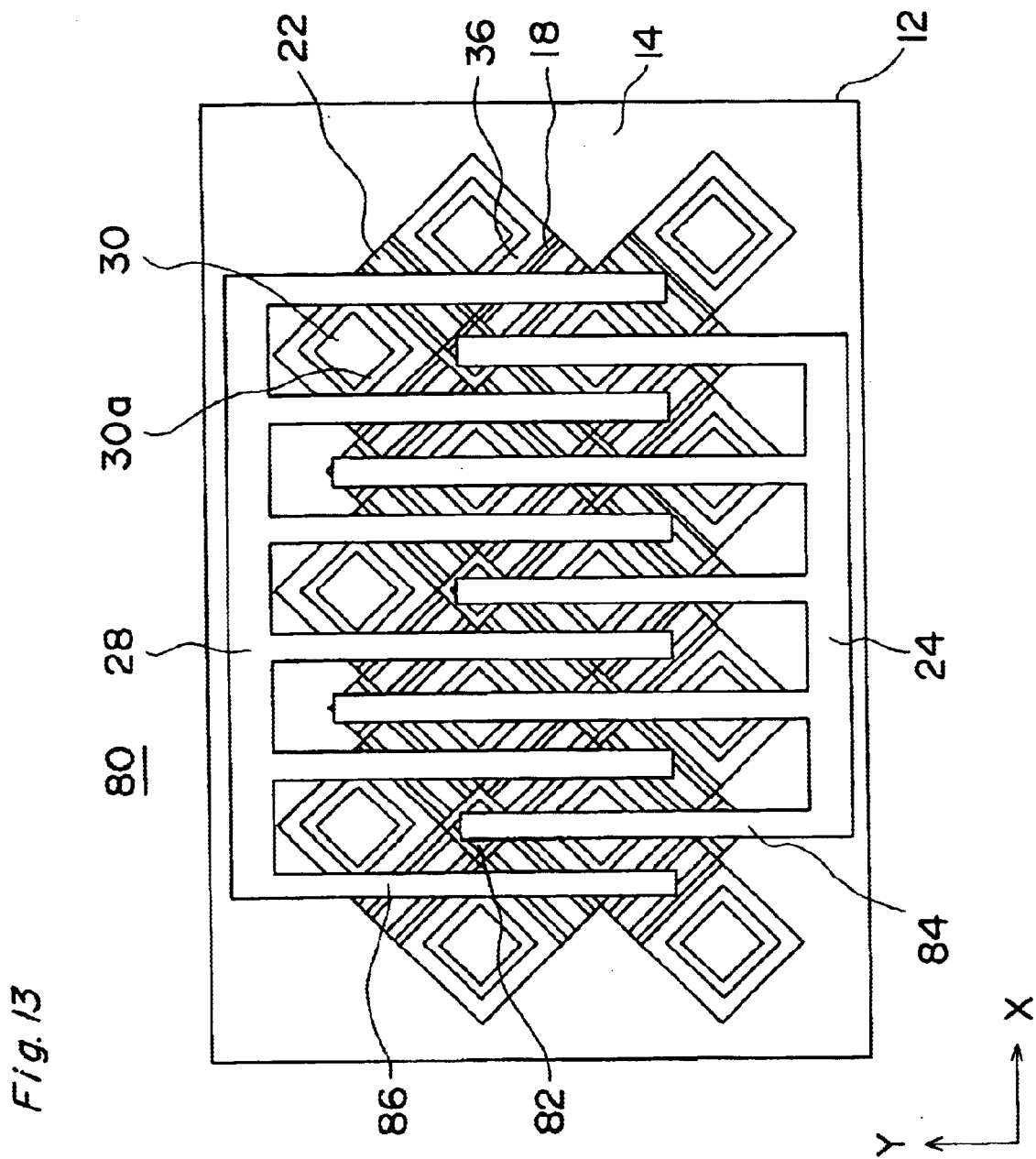
FIG. 13 is a plan view of a semiconductor device according to the fifth embodiment of the present invention.
Figure 14:
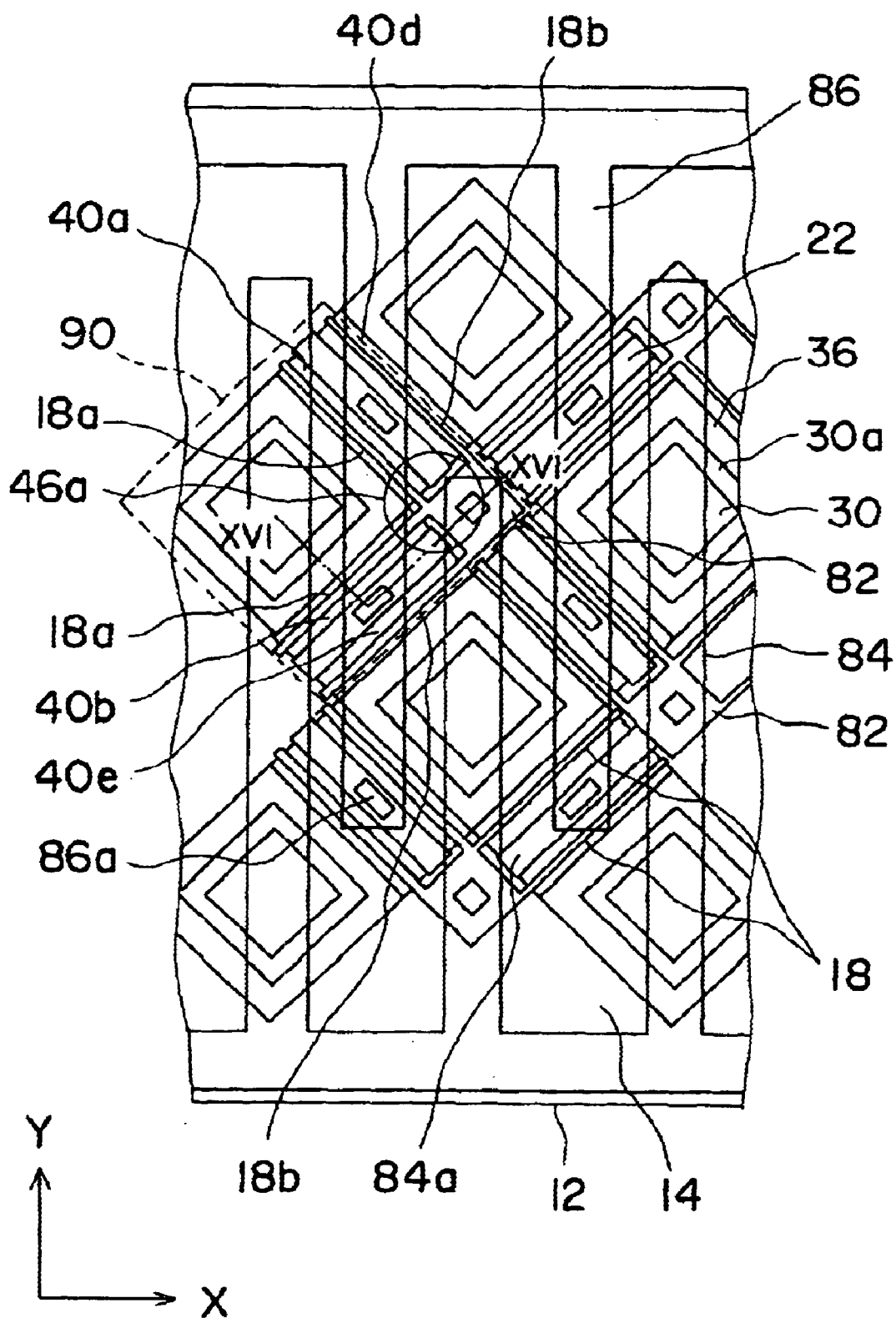
FIG. 14 is a plan view of a part of the semiconductor device according to the fifth embodiment of the present invention.

FIG. 13 is a top plan view of a FET chip (80) having a source island via-hole structure (SIV) according to this embodiment, and FIG. 14 is an enlarged view of the same. The FET chip (80) can show higher performance than the foregoing FET chips having SIV structures according to the third and fourth embodiments. The essential structure of the FET chip (80) is the same as those of the FET chips (60) and (70). However, gate-drawing pads (82) are arranged opposing to the corners of the source electrodes (36). The gate-drawing pads (82) are connected to the gate electrodes (18) which are formed on the two-way channel regions adjacent to the corners of the source electrodes. This structure is effective to prevent a decrease in FET features which is arisen when the width of the gate is increased.

This is described in detail. As shown in FIG. 14, a plurality of source electrodes (36) are formed like a lattice on the active region (16) on the substrate (12) of the FET chip (80). The arrangement of the plurality of source electrodes (36) on the active region (16) is the same as that of the third and fourth embodiments (see FIG. 8). The source electrodes (36) may be formed in the shape of rectangle, preferably of foursquare. Drain wires (22) are arranged between the opposing source electrodes (36), respectively. Gate electrodes (18a, 18b) are arranged between the source electrodes (36) and the drain wires (22), two respectively.

The gate electrodes (18a, 18b) are bent at right angles at the bending positions (46a), and they are also connected to the gate-drawing pads (82) which are formed on the active region (16) around the bending positions (46a). In other words, each two gate electrodes (18a, 18b) extend from the gate-drawing pad (82) toward two directions which are perpendicular to each other. It is preferable that the gate-drawing pad (82) is composed of Au plating layer.

Figure 15:
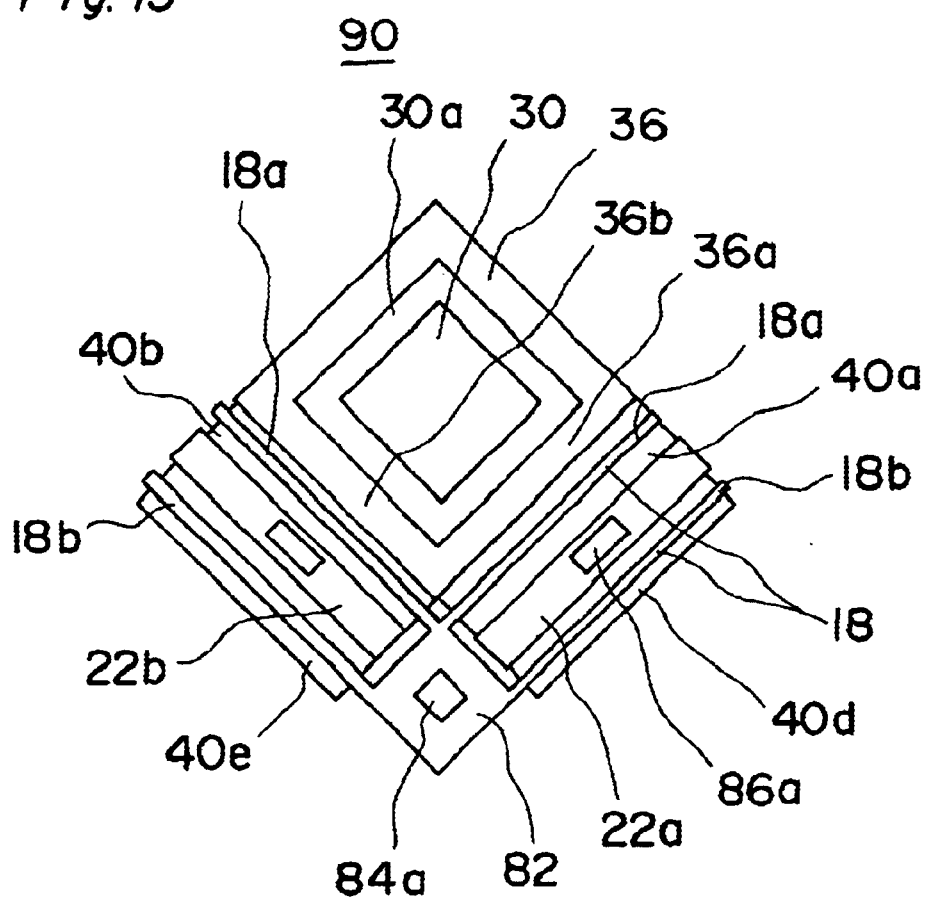
FIG. 15 is a plan view of the FET unit of the semiconductor device according to the fifth embodiment of the present invention.

The gate electrodes (18a, 18b), the gate-drawing pad (82), the source electrode (36) and the drain wires (22) compose a FET unit (90) (shown by the dotted line in FIG. 14). FIG. 15 is an enlarged view of the FET unit (90). In the FET unit (90) shown in FIG. 15, one side of the source electrode (36) is 40 $\mu$m in length. Therefore, the width in total of the gate electrodes (18a, 18b) is 160 $\mu$m (40 $\mu$m×4).

The FET units (90) are arranged as shown in FIG. 13 to provide a high density FET chip (80).

The gate pad (24) and gate air bridge wires (84) connected to the gate pad (24), and the drain pad (28) and drain air bridge wires (86) connected to the drain pad (28) are arranged on the plurality of FET units (90). The gate air bridge wires (84) and the drain air bridge wires (86) are formed along the direction of the shorter edge of the FET chip (80) (the Y-axial direction), and the gate air bridge wires (84) and the drain air bridge wires (86) are formed alternately in the direction of the longer edge of the FET chip (80) (the X-axial direction).

Figure 16:
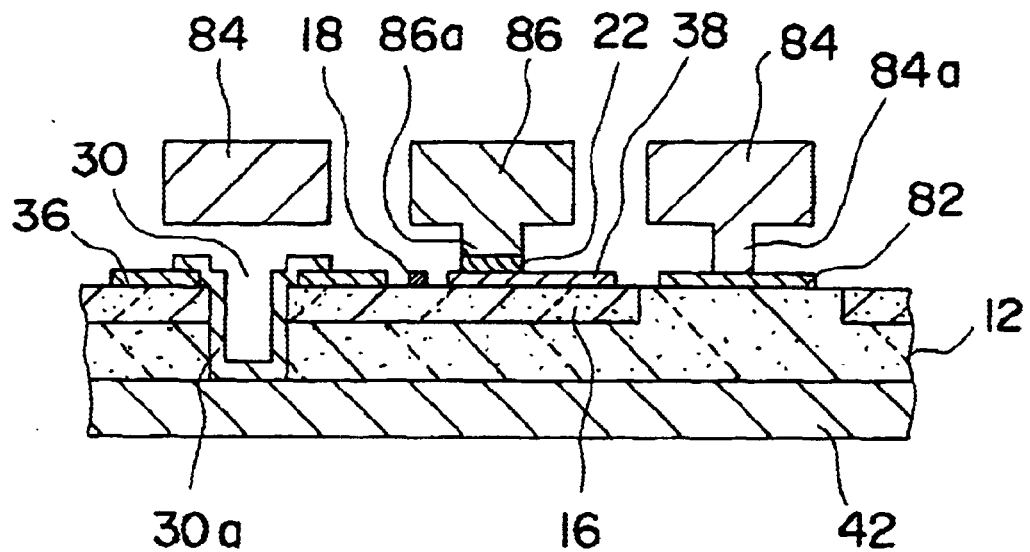
FIG. 16 is a sectional view taken along line XVI—XVI in FIG. 14.

FIG. 16 is a sectional view taken along line XVI—XVI of FIG. 14. As shown in FIG. 16, the gate air bridge wire (84) is connected to the gate-drawing pad (82) through the connection (84a). On the other hand, the drain air bridge wire (86) is connected to the drain wire (22) through the connection (86a).

Next, a process for constructing the FET chip (80) according to this embodiment is described. First, an active region (16) is formed on a substrate (12) formed from a semi-insulating GaAs in the same manner as in the third embodiment. Then, fourteen foursquare source electrodes (36) are formed like a lattice pattern so that the sides of the source electrodes (36) are inclined 45° to the longer edge of the substrate (12) (in the X-axial direction). Then, strip-like drain electrodes (38) are formed between the opposing source electrodes (36), respectively.

Next, gate electrodes (18) are formed between the source electrodes (36) and the drain electrodes (38), respectively. For example, when the length of the gate electrode is 1 $\mu$m the interval between the gate electrode and the source electrode is about 2.5 $\mu$m, and the interval between the gate electrode and the drain electrode is about 3.5 $\mu$m. Otherwise, when a T type gate electrode is used, the length of the gate electrode is, for example, about 0.1 μm, and the width of the wire layer on the gate electrode is about 1 μm.

Next, via-holes (30) and a reverse-side gold plating layer (42) are formed in the same manner as in the third embodiment. Then, gate-drawing pads (82), a gate pad (24) and a drain pad (28) are formed of Au plating layers.

Further, drain electrodes (38) and connections (84a, 86a) are formed of Au plating layers.

Finally, the gate-drawing pads (82) and the gate pad (24) are connected to each other through the gate air bridge wires (84), and the drain wires (22) and the drain pad (28) are connected to each other through the drain air bridge wires (86). Thus, the FET chip (80) is completed by the above steps.

Operation of the FET chip (80) according to this embodiment is essentially the same as that of the FET chip (10) of the first embodiment.

As mentioned above, the FET chip (80) according to this embodiment makes it possible to reduce the interval between the gate pad (24) and the drain pad (28) to $1/\sqrt{2}$ of that of the conventional structure without any change in the design rules of the conventional structure such as the interval between the source electrode (36) and the gate electrode (18) and the like, in the same manner as in the 6 FET chips (60) and (70) of the third and fourth embodiments. In addition, all the four sides of the foursquare source electrode (36) can be used as source electrodes. Therefore, it is possible to integrate the FET units at high density, and therefore possible to provide a compact FET chip with a smaller size.

Although the total width of the gate electrodes (16) included in the FET unit (90) is 160 μm as mentioned above, this unit gate width value, 160 μm, does not result from the serial connection of four gate electrodes, but results from the -parallel connection of four gate electrodes to the gate-drawing pads (82).

For this reason, the total gate width (Wgt) can be increased without an increase in gate resistance of the gate electrodes, so that the high frequency characteristics of the FET can be improved. In more detail, it becomes possible to prevent a phase shift which occurs when the width of the gate is increased, a shift of converting point of maximal stable power gain/maximal available power gain (MSG/MAG) toward the lower frequency side, which is caused by the above phase shift, and the like.

In addition, by forming an insulating regions (14c) in the same manner as in the fourth embodiment, the corners of the source electrodes (36) can be electrically neutralized, so that an increase in leak current and a decrease in pressure resistance can be prevented.

What is claimed is:

1. A semiconductor device comprising:
   a compound semiconductor substrate having a first surface and a second sure, the compound semiconductor substrate being electrically isotropic in two mutually orthogonal directions;
   first, second, and third active regions on the first surface of the substrate, the first and second active regions being separated by a first insulating region and the second and third active regions being separated by a second insulating region;
   a first semiconductor element including
      first, second, and third channel regions serially connected, adjacent channel regions having width directions essentially perpendicular to each other,
      a first source electrode and a first drain electrode, adjacent to the first, second, and third channel regions and opposing each other with the first, second, and third channel regions therebetween, and in ohmic contact with the first second, and third active regions, and
      a first gate electrode disposed on the first, second, and third channel regions and along the first source electrode and the first drain electrode, and bent at first and second bending positions; and
   a second semiconductor element on the first, second, and third active regions adjacent to the first semiconductor element, including
      fourth, fifth, and sixth channel regions serially connected, adjacent channel regions having width directions essentially perpendicular to each other, the fourth, fifth, and sixth channel regions being adjacent to the first, second, and third channel regions, respectively, with one of the first source electrode and the first drain electrode therebetween,
      a second source electrode and a second drain electrode in ohmic contact with the first, second, and third active regions, one of the second source electrode and the second drain electrode and opposing the first drain electrode or the first source electrode across the fourth, fifth, and sixth channel regions, and
      a second gate electrode on the fourth, fifth, and sixth channel regions and along one of the second source electrode and the second drain electrode, and bent at third and fourth bending positions, wherein the first insulating region is under the fist and third bending positions of the first and second gate electrodes, and the second insulating region is under the second and fourth bending positions of the first and second gate electrodes.

2. The semiconductor device according to claim 1 wherein the first source electrode is connected to a conductive film on the second surface of the semiconductor substrate through a via-hole in the first source electrode.

3. The semiconductor device according to claim 1 wherein the first bending position of the first gate electrode and the third bending position of the second gate electrode lie on a straight line substantially parallel to a longer side of the first second, and third active regions.

4. The semiconductor device according to claim 1, wherein the first gate electrode is bent in opposite directions at the first and second bending positions, and wherein the second gate electrode extends substantially at a uniform spacing from the first gate electrode.

5. The semiconductor device according to claim 1, wherein the fist gate electrode and second gate electrode share one of the first some electrode and the first drain electrode.

6. The semiconductor device according to claim 1 wherein the first gate electrode is bent at right angles at each of the first and second bending positions.

7. The semiconductor device according to claim 6 when the second gate electrode is bent at right angles at each of the third and fourth bending positions.

8. The semiconductor device according to claim 1, wherein an angle between the width direction of the first gate electrode and a longer side of the first, second and third active regions is essentially 45°.

* * * * *